(12) United States Patent
Kwon

(10) Patent No.: US 11,056,191 B2
(45) Date of Patent: Jul. 6, 2021

(54) NONVOLATILE MEMORY DEVICE HAVING DIFFERENT DQ LINES RECEIVING DQ LINE CODES AND METHOD OF OPERATING NONVOLATILE MEMORY DEVICE USING DIFFERENT THRESHOLD VOLTAGES OR ERROR MARGINS

(71) Applicant: Samsung Electronics Co., Ltd., Suwon-si (KR)

(72) Inventor: Joonsoo Kwon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 11 days.

(21) Appl. No.: 16/571,421

(22) Filed: Sep. 16, 2019

(65) Prior Publication Data

US 2020/0194073 A1 Jun. 18, 2020

(30) Foreign Application Priority Data

Dec. 17, 2018 (KR) .................. 10-2018-0163035

(51) Int. Cl.
| | |
|---|---|
| *G11C 16/10* | (2006.01) |
| *G11C 11/56* | (2006.01) |
| *G11C 16/08* | (2006.01) |
| *G11C 16/14* | (2006.01) |
| *G11C 16/26* | (2006.01) |
| *G11C 16/34* | (2006.01) |
| *G11C 16/04* | (2006.01) |

(52) U.S. Cl.
CPC .......... *G11C 16/10* (2013.01); *G11C 11/5628* (2013.01); *G11C 16/08* (2013.01); *G11C 16/14* (2013.01); *G11C 16/26* (2013.01); *G11C 16/3459* (2013.01); *G11C 16/0483* (2013.01)

(58) Field of Classification Search
CPC ..... G11C 16/10; G11C 16/14; G11C 11/5628; G11C 16/3459; G11C 16/26; G11C 16/08; G11C 16/0483; G11C 7/12; G11C 8/08; G11C 7/1051; G11C 7/1078
See application file for complete search history.

(56) References Cited

U.S. PATENT DOCUMENTS

| | | |
|---|---|---|
| 7,099,194 B2 | 8/2006 | Tu et al. |
| 7,352,628 B2 | 4/2008 | Kamei |
| 8,972,822 B2 | 3/2015 | Nakano et al. |
| 9,620,221 B1 | 4/2017 | Son |
| 9,985,659 B2 | 5/2018 | Park et al. |

(Continued)

*Primary Examiner* — Gene N Auduong
(74) *Attorney, Agent, or Firm* — Muir Patent Law, PLLC

(57) ABSTRACT

An operation method of a nonvolatile memory device includes receiving a first DQ signal representing a first data bit from an external device through a first DQ line and receiving a second DQ signal representing a second data bit from the external device through a second DQ line, and programming a first memory cell corresponding to the first DQ line and a second memory cell corresponding to the second DQ line such that the first memory cell has any one of an erase state and a first program state based on the first DQ signal and the second memory cell has any one of the erase state and a second program state based on the second DQ signal. A lower limit value of a threshold voltage distribution corresponding to the second program state is higher than a lower limit value of a threshold voltage distribution corresponding to the first program state.

20 Claims, 26 Drawing Sheets

(56) References Cited

U.S. PATENT DOCUMENTS

| | | |
|---|---|---|
| 2015/0212742 A1 | 7/2015 | Matsuzawa |
| 2016/0358657 A1* | 12/2016 | Kim .................... G11C 7/1063 |
| 2018/0211715 A1 | 7/2018 | Cho et al. |
| 2018/0217834 A1 | 8/2018 | Park et al. |
| 2018/0261296 A1 | 9/2018 | Choi et al. |
| 2019/0265900 A1* | 8/2019 | Kim ........................ G11C 7/20 |

* cited by examiner

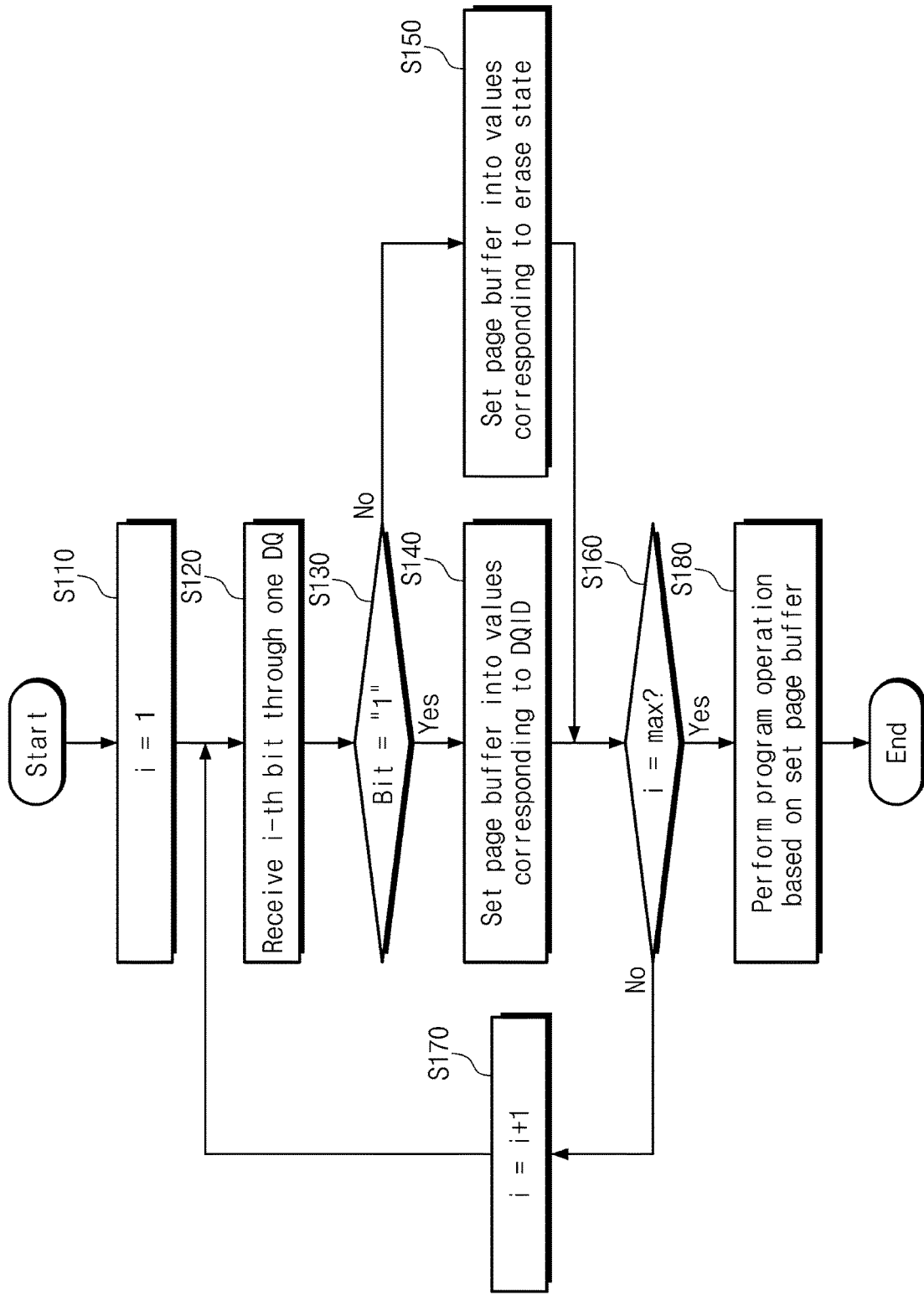

NONVOLATILE MEMORY DEVICE HAVING DIFFERENT DQ LINES RECEIVING DQ LINE CODES AND METHOD OF OPERATING NONVOLATILE MEMORY DEVICE USING DIFFERENT THRESHOLD VOLTAGES OR ERROR MARGINS

CROSS-REFERENCE TO RELATED APPLICATIONS

This application claims priority under 35 U.S.C. § 119 to Korean Patent Application No. 10-2018-0163035 filed on Dec. 17, 2018, in the Korean Intellectual Property Office, the disclosure of which is incorporated by reference herein in its entirety.

BACKGROUND

Embodiments of the inventive concept described herein relate to a semiconductor memory, and more particularly, relate to a nonvolatile memory device and an operation method thereof.

A semiconductor memory device is classified as a volatile memory device, in which stored data disappear when a power is turned off, such as a static random access memory (SRAM) or a dynamic random access memory (DRAM), or a nonvolatile memory device, in which stored data are retained even when a power is turned off, such as a flash memory device, a phase-change RAM (PRAM), a magnetic RAM (MRAM), a resistive RAM (RRAM), or a ferroelectric RAM (FRAM).

The flash memory device is configured to store data by changing threshold voltages of memory cells. In the case where a difference between threshold voltages of memory cells for determining data is small, an error of data read from the memory cells increases.

SUMMARY

Embodiments of the inventive concept provide a nonvolatile memory device having improved performance and improved reliability by differently setting error margins of memory cells included in the nonvolatile memory device based on a signal line and an operation method thereof.

According to an example embodiment, an operation method of a nonvolatile memory device includes receiving a first DQ signal representing a first data bit from an external device through a first DQ line and receiving a second DQ signal representing a second data bit from the external device through a second DQ line, and programming a first memory cell corresponding to the first DQ line and a second memory cell corresponding to the second DQ line such that the first memory cell has any one of an erase state and a first program state based on the first DQ signal and the second memory cell has any one of the erase state and a second program state based on the second DQ signal. A lower limit value of a threshold voltage distribution corresponding to the second program state is higher than a lower limit value of a threshold voltage distribution corresponding to the first program state.

According to an example embodiment, a nonvolatile memory device includes a first memory cell connected to a first word line and a first bit line, a second memory cell connected to the first word line and a second bit line, an input/output circuit that outputs a first data bit, corresponding to a first DQ signal received on a first DQ line from an external device, through a first data line and outputs a second data bit, corresponding to a first DQ signal received on a second DQ line from the external device, through a second data line, a first page buffer that is connected to the first bit line and the first data line and stores a first latch value based on the first data bit received through the first data line and a first DQ identifier for the first DQ line, and a second page buffer that is connected to the second bit line and the second data line, and stores a second latch value based on the second data bit received through the second data line and a second DQ identifier for the second DQ line.

According to an example embodiment, an operation method of a nonvolatile memory device includes receiving a first DQ signal representing first data from an external device through a first DQ line and receiving a second DQ signal representing second data from the external device through a second DQ line, and programming a plurality of first memory cells corresponding to the first DQ line respectively based on the first data and programming a plurality of second memory cells corresponding to the second DQ line respectively based on the second data. An error margin of the plurality of second memory cells is greater than an error margin of the plurality of first memory cells.

BRIEF DESCRIPTION OF THE FIGURES

The above and other objects and features of the inventive concept will become apparent by describing in detail example embodiments thereof with reference to the accompanying drawings.

FIG. 6 is a flowchart for describing a program operation of a nonvolatile memory device of FIG. 4 in detail.

DETAILED DESCRIPTION

Below, embodiments of the inventive concept may be described in detail and clearly to such an extent that an ordinary one in the art easily implements the inventive concept.

Figure 1:
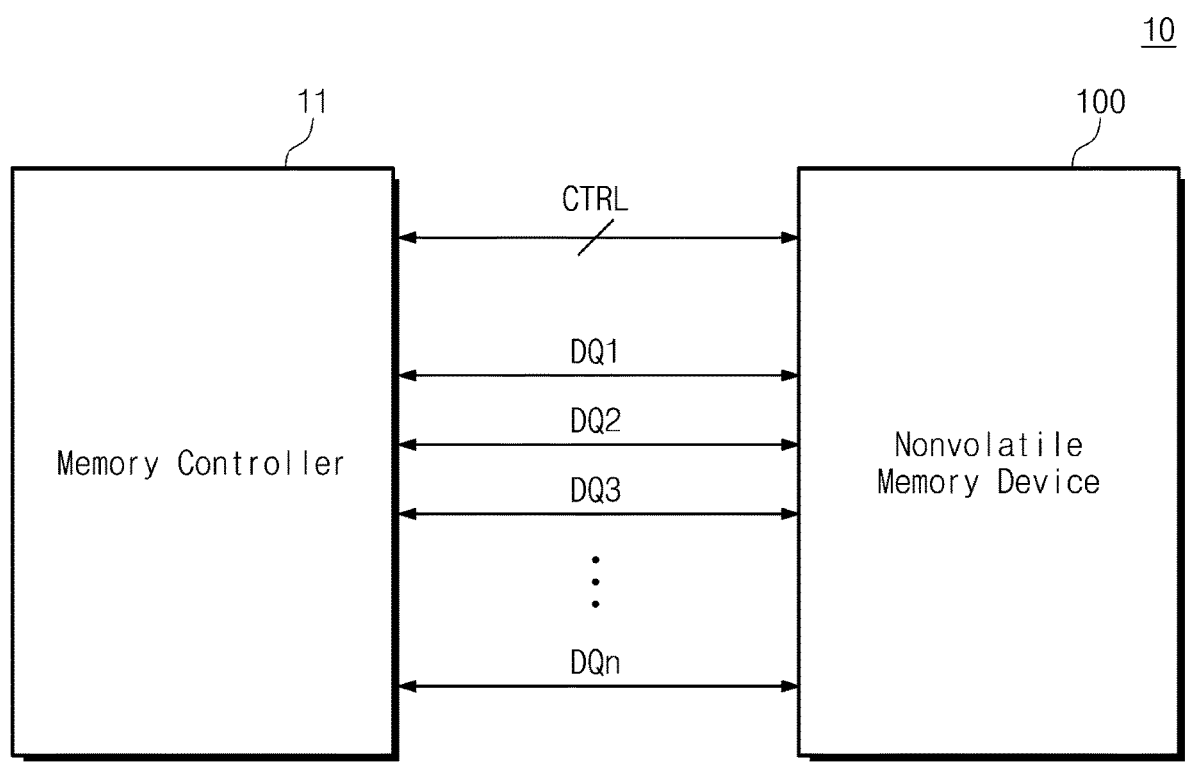
FIG. 1 is a block diagram illustrating a storage device according to an embodiment of the inventive concept.

FIG. 1 is a block diagram illustrating a storage device according to an embodiment of the inventive concept. Referring to FIG. 1, a storage device 10 may include a memory controller 11 and a nonvolatile memory device 100.

The memory controller 11 may be configured to control the nonvolatile memory device 100. For example, the memory controller 11 may provide a control signal CTRL to the nonvolatile memory device 100 and may exchange data with the nonvolatile memory device 100 through a plurality of signal lines DQ1 to DQn (hereinafter referred to as "DQ lines").

In response to the control signal CTRL from the memory controller 11, the nonvolatile memory device 100 may store data provided through the plurality of DQ lines DQ1 to DQn or may output data through the plurality of DQ lines DQ1 to DQn. In an example embodiment, the nonvolatile memory device 100 may be a NAND flash memory device (e.g., in the form of a semiconductor chip formed on a die from a wafer, a stack of such semiconductor chips, or semiconductor package including one of more semiconductor chips formed on a package substrate), may receive information such as a command, an address, etc. through the plurality of DQ lines DQ1 to DQn, and may identify a type (e.g., a command, an address, data, etc.) of the signals received through the plurality of DQ lines DQ1 to DQn based on the control signal CTRL. However, the inventive concept is not limited thereto.

In an example embodiment, the nonvolatile memory device 100 according to an embodiment of the inventive concept may perform a program operation such that the plurality of DQ lines DQ1 to DQn have different error margins. For example, the nonvolatile memory device 100 may program first data received through the first DQ line DQ1 so as to have a first error margin and may program second data received through the second DQ line DQ2 so as to have a second error margin different from the first error margin. The nonvolatile memory device 100 according to an embodiment of the inventive concept and an operation method thereof will be described with reference to accompanying drawings.

Figure 2:
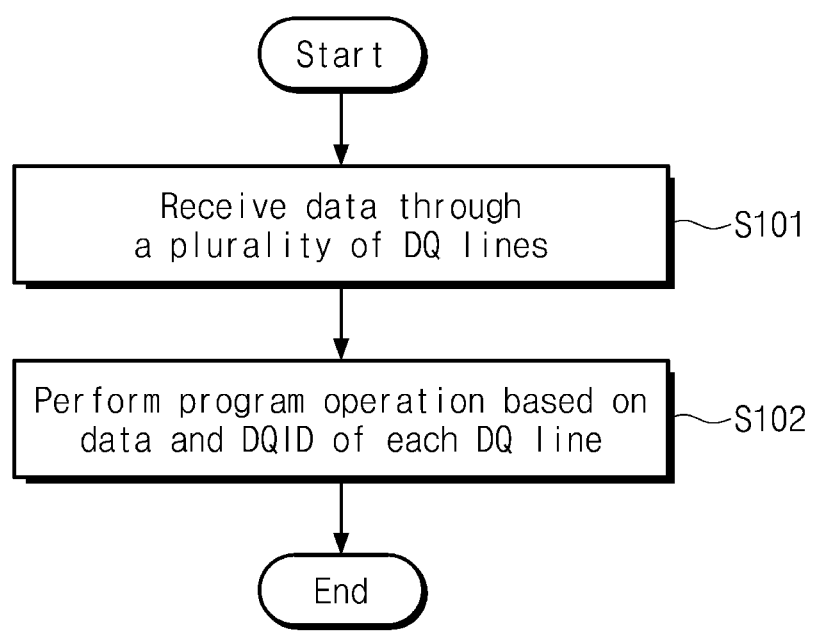
FIG. 2 is a flowchart illustrating an operation method of a nonvolatile memory device of FIG. 1.

FIG. 2 is a flowchart illustrating an operation method of a nonvolatile memory device of FIG. 1. Referring to FIGS. 1 and 2, in operation S101, the nonvolatile memory device 100 may receive data from the plurality of DQ lines DQ1 to DQn. For example, to store data in the nonvolatile memory device 100, the memory controller 11 may transmit the data to the nonvolatile memory device 100 through the plurality of DQ lines DQ1 to DQn. The nonvolatile memory device 100 may identify the data received through the plurality of DQ lines DQ1 to DQn based on the control signal CTRL (e.g., a data strobe signal DQS).

In operation S102, the nonvolatile memory device 100 may perform the program operation based on the received data and a DQ identifier DQID for each DQ line. For example, the nonvolatile memory device 100 may perform the program operation on first data received through the first DQ line DQ1 based on a DQ identifier (e.g., DQID1) for the first DQ line DQ1 and the received first data, and may perform the program operation on second data received through the second DQ line DQ2 based on a DQ identifier (e.g., DQID2) for the second DQ line DQ2 and the received second data. These DQ identifiers correspond to, and include data associated with their respective DQ lines, and may alternatively be referred to as DQ line codes. In this case, even though the first and second data have the same bit value, error margins of the first and second data may be different. Alternatively, even though the first and second data have the same bit value, a threshold voltage distribution (or a program state) of memory cells in which the first data are stored may be different from a threshold voltage distribution (or a program state) of memory cells in which the second data are stored.

For example, according to an embodiment of the inventive concept, the nonvolatile memory device 100 may perform the program operation based on received data and a DQ identifier DQID, and thus, error margins of the plurality of DQ lines DQ1 to DQn may be different.

Figure 3:
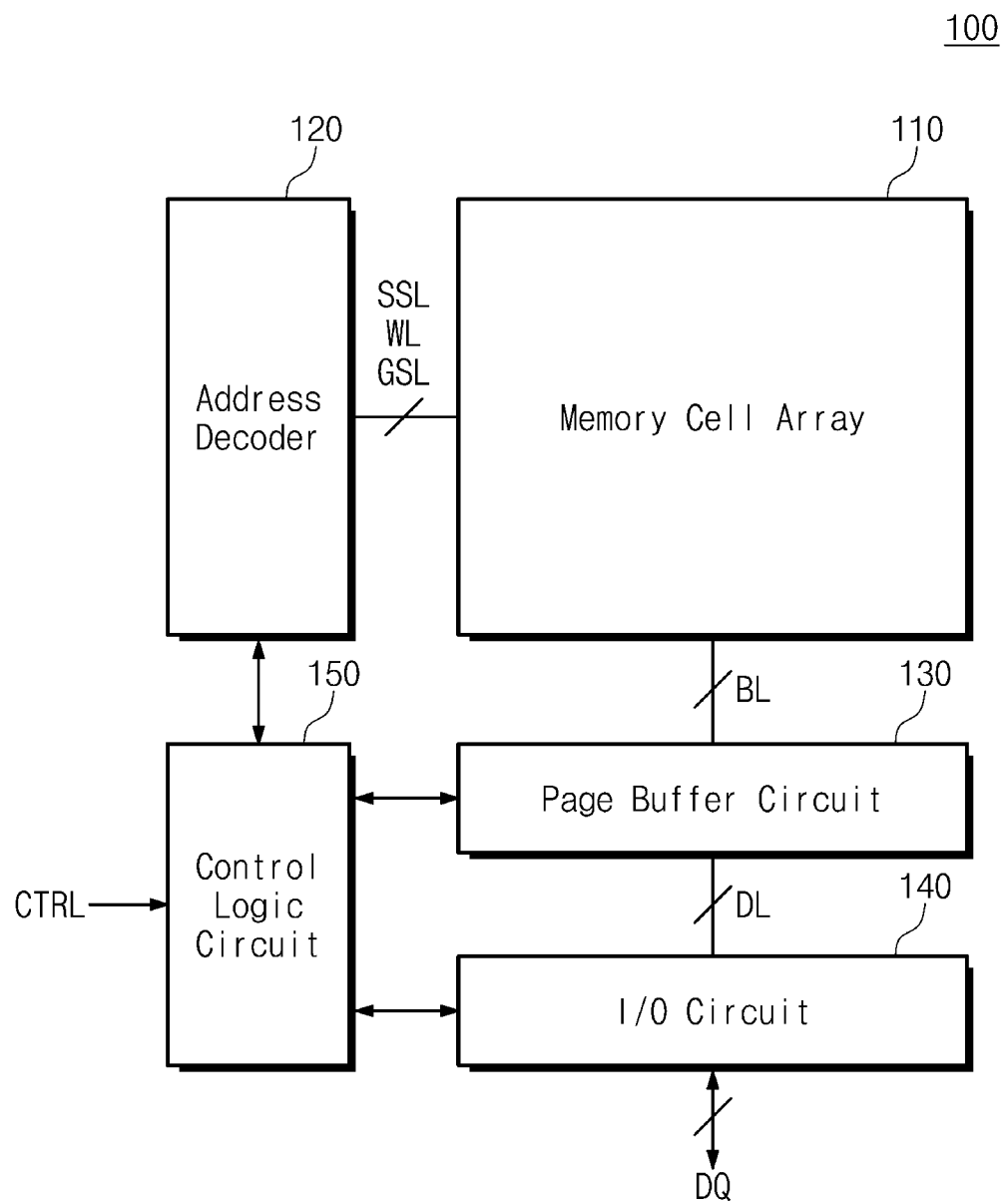
FIG. 3 is a block diagram illustrating a nonvolatile memory device of FIG. 1.

FIG. 3 is a block diagram illustrating a nonvolatile memory device of FIG. 1. Referring to FIGS. 1 and 3, the nonvolatile memory device 100 may include a memory cell array 110, an address decoder 120, a page buffer circuit 130, an input/output circuit 140, and a control logic circuit 150.

The memory cell array 110 may include a plurality of memory blocks. Each of the memory blocks may include a plurality of cell strings, each of which includes a plurality of cell transistors connected in series between a bit line and a common source line. The plurality of cell transistors may be connected with string selection lines SSL, word lines WL, and ground selection lines GSL. Each of the plurality of cell transistors (e.g., memory cells) may be configured to store at least 1-bit data through the program operation of the nonvolatile memory device 100. In an example embodiment, each of the plurality of memory cells may be programmed to have a different error margin for each corresponding DQ line.

The address decoder 120 may be connected with the memory cell array 110 through the string selection lines SSL, the word lines WL, and the ground selection lines GSL. The address decoder 120 may decode an address ADDR received from the memory controller 11 and may individually control voltages of the string selection lines SSL, the word lines WL, and the ground selection lines GSL based on the decoded address.

The page buffer circuit 130 may be connected with the memory cell array 110 through a plurality of bit lines BL. The page buffer circuit 130 may be configured to temporarily store data read from the memory cell array 110 or data provided from the memory cell array 140. Although not illustrated in FIG. 3, the page buffer circuit 130 may include a plurality of page buffers respectively corresponding to the plurality of bit lines BL. Each of the plurality of page buffers may include data latches or cache latches configured to temporarily store data.

The input/output circuit 140 may be connected with the page buffer circuit 130 through a plurality of data lines DL. The plurality of data lines DL may be respectively connected with the plurality of page buffers or may respectively correspond to the plurality of page buffers. The input/output circuit 140 may exchange data with the memory controller 11 through a plurality of DQ lines DQ. In an example embodiment, the input/output circuit 140 may provide data received from any one of the plurality of DQ lines DQ to one or more of the plurality of data lines DL. For example, one of the plurality of DQ lines DQ may correspond to one or more of the plurality of data lines DL.

The control logic circuit 150 may control overall operations of the nonvolatile memory device 100. For example, the control logic circuit 150 may control the address decoder 120, the page buffer circuit 130, and the input/output circuit 140 in response to the control signal CTRL from the memory controller 11.

Figure 4:
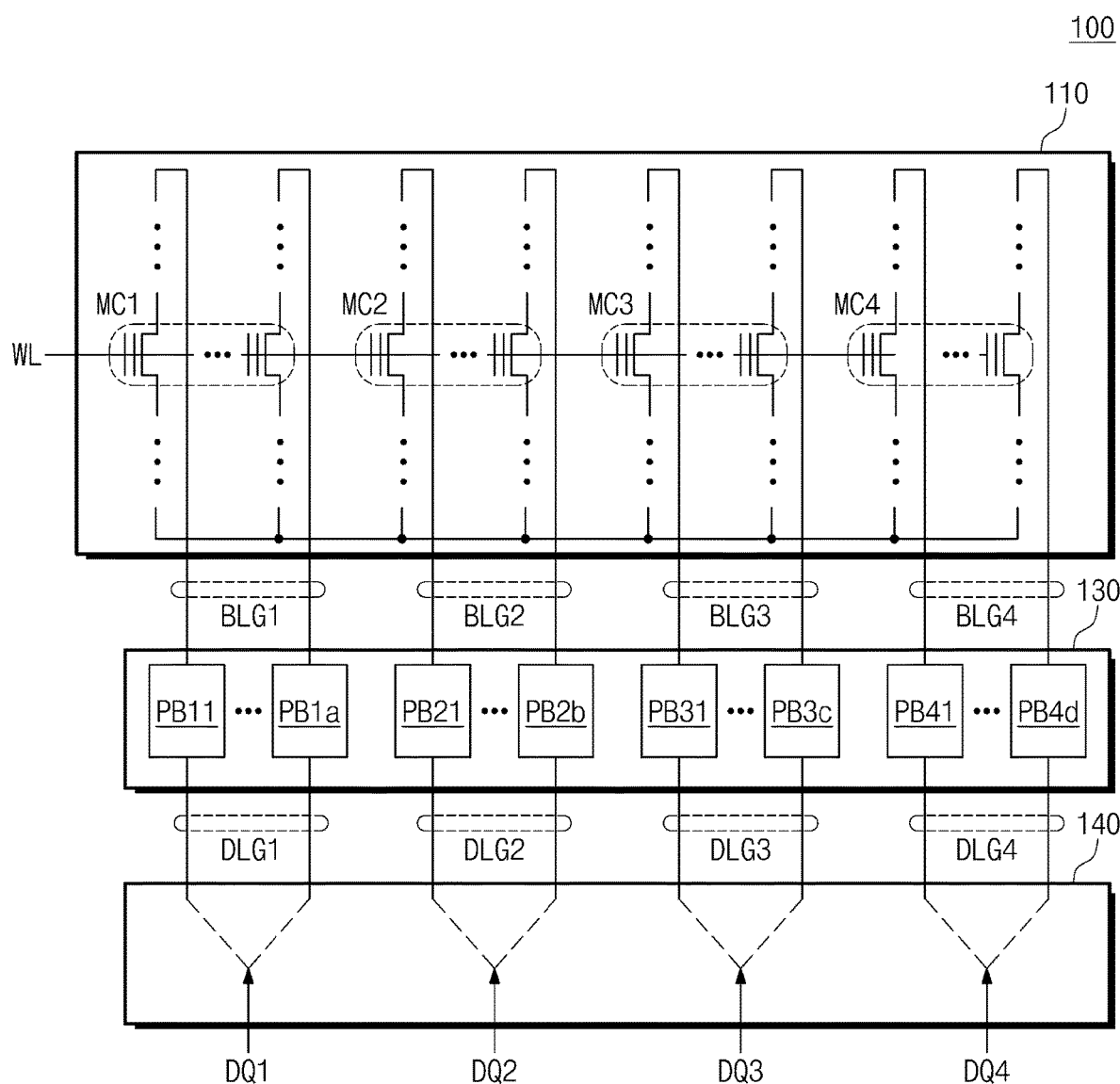
FIG. 4 is a diagram illustrating a partial configuration of a nonvolatile memory device of FIG. 3 in detail.

FIG. 4 is a diagram illustrating a partial configuration of a nonvolatile memory device of FIG. 3 in detail. For brevity of illustration and convenience of description, a partial configuration of the nonvolatile memory device 100 is omitted in the embodiment of FIG. 4. Below, to describe an embodiment of the inventive concept easily, it is assumed that the nonvolatile memory device 100 exchanges data with the memory controller 11 through first to fourth DQ lines DQ1 to DQ4. However, the inventive concept is not limited thereto. For example, the number of DQ lines may be variously changed.

Referring to FIGS. 1, 3, and 4, the memory cell array 110 may include a plurality of memory cells MC1 to MC4. The plurality of memory cells MC1 to MC4 may be connected to one word line WL. Each of the plurality of memory cells MC1 to MC4 may be connected to a corresponding bit line. In an example embodiment, a plurality of bit lines may be divided into first to fourth bit line groups BLG1 to BLG4.

The page buffer circuit 130 may include a plurality of page buffers PB11 to PB4d. Each of the plurality of page buffers PB11 to PB4d may be connected to a corresponding bit line. For example, bit lines of the first bit line group BLG1 may be respectively connected with the page buffers PB11 to PB1a. Bit lines of the second bit line group BLG2 may be respectively connected with the page buffers PB21 to PB2b. Bit lines of the third bit line group BLG3 may be respectively connected with the page buffers PB31 to PB3c. Bit lines of the fourth bit line group BLG4 may be respectively connected with the page buffers PB41 to PB4d.

Each of the page buffers PB41 to PB4d may temporarily store data to be stored in a memory cell connected with the corresponding bit line. For example, the page buffers PB11 to PB1a connected with the first bit line group BLG1 may temporarily store data to be stored in the first memory cells MC1 connected with the first bit line group BLG1. Likewise, the page buffers PB21 to PB2a connected with the second bit line group BLG2 may temporarily store data to be stored in the second memory cells MC2 connected with the second bit line group BLG2, the page buffers PB31 to PB3a connected with the third bit line group BLG3 may temporarily store data to be stored in the third memory cells MC3 connected with the third bit line group BLG3, and the page buffers PB41 to PB4a connected with the fourth bit line group BLG4 may temporarily store data to be stored in the fourth memory cells MC4 connected with the fourth bit line group BLG4.

The input/output circuit 140 may provide data received through the first to fourth DQ lines DQ1 to DQ4 to corresponding page buffers PB11 to PB4d through a corresponding data line. For example, the input/output circuit 140 may provide data received through the first DQ line DQ1 to the page buffers PB11 to PB1a associated with a first data line group DLG1, and may provide data received through the second DQ line DQ2 to the page buffers PB21 to PB2a associated with a second data line group DLG2. Likewise, the input/output circuit 140 may provide data received through the third DQ line DQ3 to the page buffers PB31 to PB3a associated with a third data line group DLG3, and may provide data received through the fourth DQ line DQ4 to the page buffers PB41 to PB4a associated with a fourth data line group DLG4.

As described above, the first to fourth DQ lines DQ1 to DQ4 may respectively correspond to the first to fourth data line groups DLG1 to DLG4, the first to fourth data line groups DLG1 to DLG4 may be respectively connected with the page buffers PB11 to PB1a, PB21 to PB2b, PB31 to PB3c, and PB41 to PB4d connected with the first to fourth bit line groups BLG1 to BLG4, and the first to fourth bit line groups BLG1 to BLG4 may be connected with the first to fourth memory cells MC1 to MC4.

Below, for convenience of description, the expressions "a data line corresponding to a specific DQ line", "a page buffer corresponding to the specific DQ line", "a bit line corresponding to the specific DQ line", "a memory cell corresponding to the specific DQ line", etc. may be used, and the meaning of the expressions may be determined based on a connection relationship between components disclosed in the specification.

Figure 5:
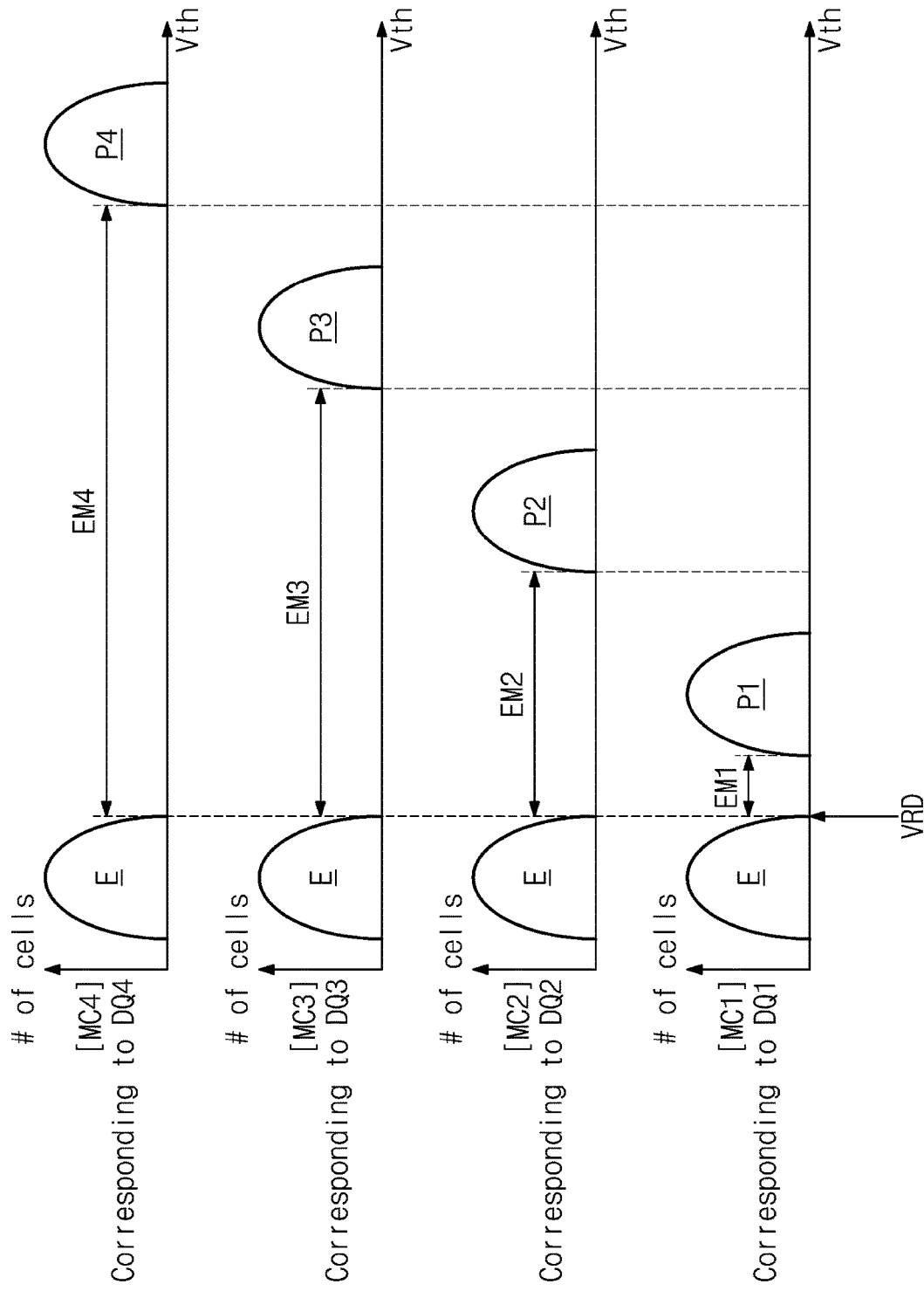
FIG. 5 is a diagram illustrating threshold voltage distributions of memory cells for describing a program operation of a nonvolatile memory device of FIG. 4.

FIG. 5 is a diagram illustrating threshold voltage distributions of memory cells for describing a program operation of a nonvolatile memory device of FIG. 4. Referring to FIGS. 4 and 5, the nonvolatile memory device 100 may perform the program operation on data received from the first to fourth DQ lines DQ1 to DQ4 so as to have different error margins.

For example, data received through the first DQ line DQ1 may be stored in the first memory cells MC1 corresponding to the first DQ line DQ1, data received through the second DQ line DQ2 may be stored in the second memory cells MC2 corresponding to the second DQ line DQ2, data received through the third DQ line DQ3 may be stored in the third memory cells MC3 corresponding to the third DQ line DQ3, and data received through the fourth DQ line DQ4 may be stored in the fourth memory cells MC4 corresponding to the fourth DQ line DQ4.

In this case, each of the first to fourth memory cells MC1 to MC4 may be configured to store one bit. For example, as illustrated in FIG. 5, the first memory cells MC1 may be programmed to have any one of an erase state "E" and a first program state P1 based on the data received through the first DQ line DQ1, the second memory cells MC2 may be programmed to have any one of the erase state "E" and a second program state P2 based on the data received through the second DQ line DQ2, the third memory cells MC3 may be programmed to have any one of the erase state "E" and a third program state P3 based on the data received through the third DQ line DQ3, and the fourth memory cells MC4 may be programmed to have any one of the erase state "E" and a fourth program state P4 based on the data received through the fourth DQ line DQ4.

For example, each of the first to fourth memory cells MC1 to MC4 may store one bit and may have a different error margin based on the corresponding DQ line. For example, as illustrated in FIG. 5, the first memory cells MC1 corresponding to the first DQ line DQ1 may have a first error margin EM1, and the second memory cells MC2 corresponding to the second DQ line DQ2 may have a second error margin EM2. Likewise, the third memory cells MC3 corresponding to the third DQ line DQ3 may have a third error margin EM3, and the fourth memory cells MC4 corresponding to the fourth DQ line DQ4 may have a fourth error margin EM4.

In an example embodiment, the error margin may indicate a difference between a lower limit value of a program state (e.g., P1, P2, P3, or P4) and a read voltage VRD. Where the error margin is greater, the probability that an error is present in a result of a read operation using the read voltage VRD is lower. As shown in the example of FIG. 5, in some embodiments, the different program states P1, P2, P3, and P4, which represent the same data state for different memory cells, have different threshold voltage distributions. The different threshold voltage distributions may be non-overlapping with each other. Also, a lower limit value of a threshold voltage distribution corresponding to certain program states is lower than a lower limit value of a threshold voltage distribution corresponding to higher level program states. For example a lower limit value of a threshold voltage distribution corresponding to the program state "P1" is higher than a lower limit value (as well as an upper limit value) of a threshold voltage distribution corresponding to the erase state "E," a lower limit value of a threshold voltage distribution corresponding to the program state "P2" is higher than a lower limit value (as well as an upper limit value) of a threshold voltage distribution corresponding to the program state "P1," etc.

For example, the nonvolatile memory device 100 according to an embodiment of the inventive concept may improve the reliability of data output through specific DQ lines by programming memory cells so as to have a different error margin for each DQ line. In this case, because the burden due to a separate error correction operation decreases, a nonvolatile memory device with improved performance and improved reliability is provided.

FIG. 6 is a flowchart for describing a program operation of a nonvolatile memory device of FIG. 4 in detail. In an example embodiment, it is assumed that a data bit of "1" corresponds a program state of a memory cell and a data bit of "0" corresponds to an erase state of a memory cell. However, the inventive concept is not limited thereto. For example, the above-described correspondence relationship may be interchangeable depending on a bit ordering for a program state of memory cells.

Referring to FIGS. 1, 4, and 5, in operation S110, a variable "i" is set to "1". The variable "i" is a simple reference sign for describing data sequentially received through one DQ line, and is not intended to limit the inventive concept.

In operation S120, the nonvolatile memory device 100 may receive an i-th bit through one DQ line. For example, the nonvolatile memory device 100 may receive the i-th bit from the memory controller 11 through one DQ line. Though described as an i-th bit herein, the "bit" received on a data line is actually a data signal, or DQ signal, that represents the bit. For example, the data signal will have a particular voltage that represents a bit (e.g., a high voltage to represent a first bit or data state, such as "1", and a low voltage to represent a second bit or data state, such as "0").

In operation S130, the nonvolatile memory device 100 may determine whether a value of the received DQ signal corresponds to a bit value of "1".

When the value of the received bit is "1", in operation S140, the nonvolatile memory device 100 sets a page buffer to a value corresponding to a DQ identifier DQID.

When the value of the received bit is "0", in operation S150, the nonvolatile memory device 100 sets a page buffer to a value corresponding to the erase state.

In operation S160, whether the variable "i" is a maximum value is determined. For example, whether all bits are received through one DQ line is determined. When the variable "i" is not the maximum value, in operation S170, the variable "i" may increase as much as "1", and operation S120 is performed.

When the variable "i" is the maximum value (i.e., when all bits are received through one DQ line), in operation S180, the nonvolatile memory device 100 may perform the program operation based on the set page buffers.

In an example embodiment, an operation of programming data received through one DQ line is described with reference to the flowchart of FIG. 6, but the inventive concept is not limited thereto. For example, after setting a plurality of page buffers based on data received through a plurality of DQ lines as described with reference to the flowchart of FIG. 6, the nonvolatile memory device 100 may perform the program operation in the unit of a word line.

Figure 7A:
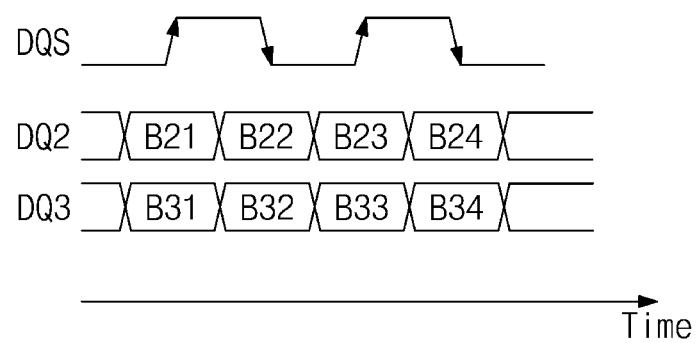
FIGS. 7A and 7B are exemplary diagrams for describing the flowchart of FIG. 6 in detail.
Figure 7B:
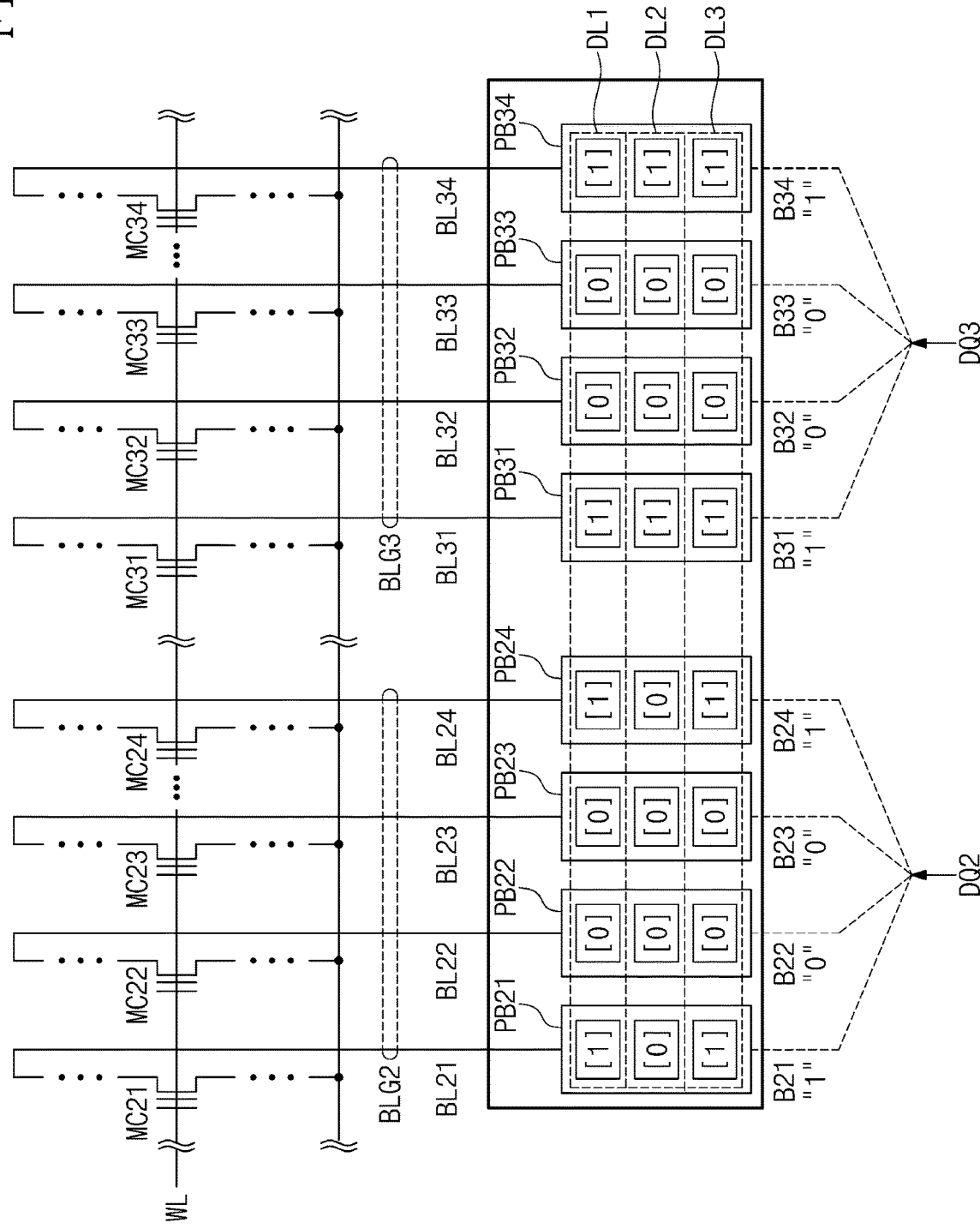

FIGS. 7A and 7B are exemplary diagrams for describing the flowchart of FIG. 6 in detail. For brevity of illustration, some components are omitted in FIG. 7B.

Referring to FIGS. 4, 7A, and 7B, the nonvolatile memory device 100 may sequentially receive bits B21 to B24 through the second DQ line DQ2, and may sequentially receive bits B31 to B34 through the third DQ line DQ3. For example, as illustrated in FIG. 7A, the nonvolatile memory device 100 may receive the bits B21 to B24 synchronized with the data strobe signal DQS through the second DQ line DQ2 and may receive the bits B31 to B34 synchronized with the data strobe signal DQS through the third DQ line DQ3 (e.g., to be received at the same time as a rising or falling edge of the data strobe signal).

The page buffers PB21, PB22, PB23, and PB24 corresponding to the second DQ line DQ2 may be respectively or sequentially set based on the bits B21 to B24 received through the second DQ line DQ2, and the page buffers PB31, PB32, PB33, and PB34 corresponding to the third DQ line DQ3 may be respectively or sequentially set based on the bits B31 to B34 received through the third DQ line DQ3. A relationship between the page buffers PB21, PB22, PB23, PB24, PB31, PB32, PB33, and PB34, the bit line groups BLG2 and BLG3, and the DQ lines DQ2 and DQ3 is described above, and thus, additional description will be omitted to avoid redundancy.

For example, each of the page buffers PB21, PB22, PB23, PB24, PB31, PB32, PB33, and PB34 may include first to third data latches DL1, DL2, and DL3. Each of the first to third data latches DL1, DL2, and DL3 may be configured to store or latch a bit value of "1" or a bit value of "0".

In an example embodiment, it is assumed that a DQ identifier DQID of the second DQ line DQ2 is "101", a DQ identifier DQID of the third DQ line DQ3 is "111" (e.g., which has a different value from the DQ identifier DQID of the second DQ line DQ2), and a value corresponding to an erase state is "000". However, the inventive concept is not limited thereto. For example, the DQ identifier may be variously changed or modified according to a program manner, a bit ordering, etc. of the nonvolatile memory device 100

When the bits B22 and B23 received through the second DQ line DQ2 and the bits B32 and B33 received through the third DQ line DQ3 are all "0", the page buffers PB22, PB23, PR32, and PB33 respectively corresponding to the bits B22, B23, B32, and B33 may be set to the value corresponding to the erase sate. For example, all the first to third data latches DL1, DL2, and DL3 of each of the page buffers PB22, PB23, PR32, and PB33 may be set to a value of "0".

When the bits B21 and B24 received through the second DQ line DQ2 are all "1", the page buffers PB21 and PB24 corresponding to the bits B21 and B24 may be set to the value corresponding to the DQ identifier. For example, the first to third data latches DL1, DL2, and DL3 of each of the page buffers PB21 and PB24 may be set to values of "1", "0", and "1".

When the bits B31 and B34 received through the third DQ line DQ3 are all "1", the page buffers PB31 and PB34 corresponding to the bits B31 and B34 may be set to the value corresponding to the DQ identifier. For example, the first to third data latches DL1, DL2, and DL3 of each of the page buffers PB31 and PB34 may be set to values of "1", "1", and "1".

As described with reference to FIG. 7B, even though the same bit value is received through different DQ lines, different values may be set to page buffers based on the DQ identifiers. Error margins of memory cells may be differently set for respective DQ lines through the above way to set page buffers.

Figure 8:
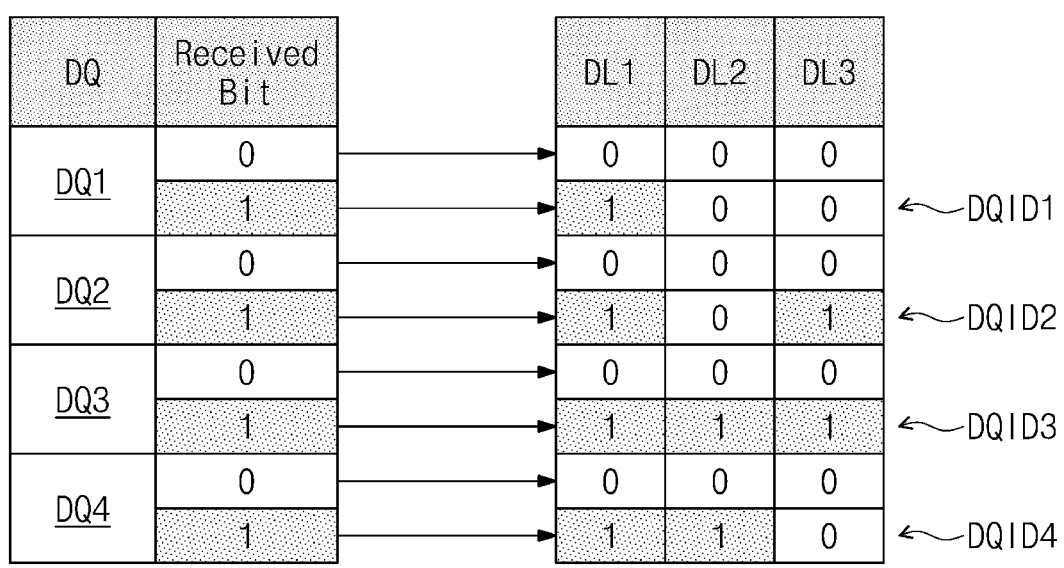
FIG. 8 is a diagram illustrating a value of data latches set according to a bit received through each DQ line, in a nonvolatile memory device of FIG. 2.
Figure 9:
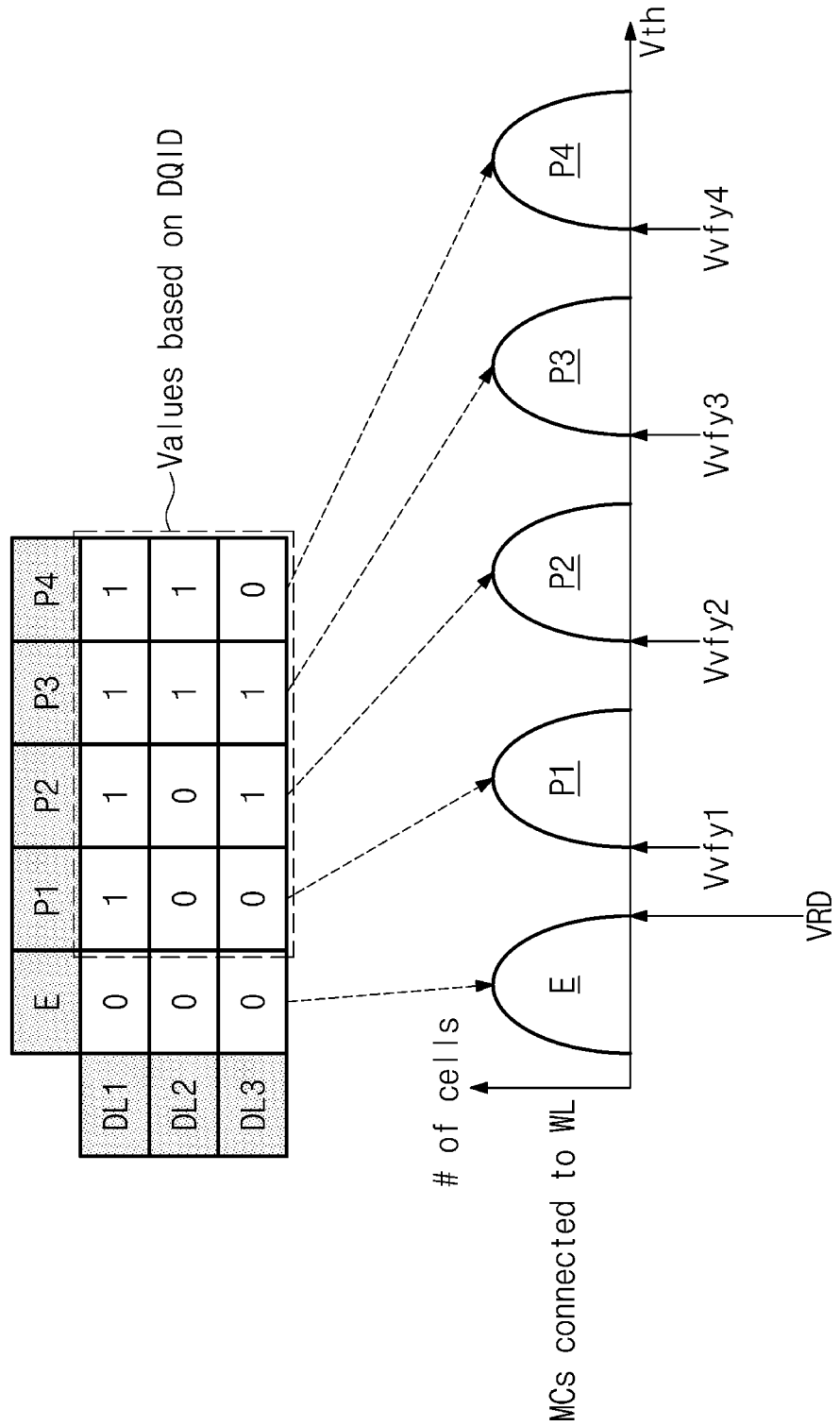
FIG. 9 is a diagram illustrating threshold voltage distributions of memory cells programmed according to a page buffer setting manner of FIG. 8.

FIG. 8 is a diagram illustrating a value of data latches set according to a bit received through each DQ line, in a nonvolatile memory device of FIG. 2, according to an example embodiment. FIG. 9 is a diagram illustrating threshold voltage distributions of memory cells programmed according to a page buffer setting manner of FIG. 8.

Referring to FIGS. 2 and 8, for each of the first to fourth DQ lines DQ1 to DQ4, when a bit value of "0" is received, all the first to third data latches DL1 to DL3 of a page buffer corresponding to each DQ line are set to "0".

For each of the first to fourth DQ lines DQ1 to DQ4, when a bit value of "1" is received, the first to third data latches DL1 to DL3 of a page buffer corresponding to each DQ line is set to a value of a DQ identifier corresponding to the respective DQ line. For example, a DQ identifier DQID1 of the first DQ line DQ1 may be "100", a DQ identifier DQID2 of the second DQ line DQ2 may be "101", a DQ identifier DQID3 of the third DQ line DQ3 may be "111", and a DQ identifier DQID4 of the fourth DQ line DQ4 may be "110". However, the inventive concept is not limited thereto. For example, the DQ identifier may be variously changed.

When a bit value of "1" is received through the first DQ line DQ1, the first to third data latches DL1 to DL3 of a page buffer corresponding to the first DQ line DQ1 may be respectively set to values of "1", "0", and "0". When a bit value of "1" is received through the second DQ line DQ2, the first to third data latches DL1 to DL3 of a page buffer corresponding to the second DQ line DQ2 may be respectively set to values of "1", "0", and "1". When a bit value of "1" is received through the third DQ line DQ3, the first to third data latches DL1 to DL3 of a page buffer corresponding to the third DQ line DQ3 may be respectively set to values of "1", "1", and "1". When a bit value of "1" is received through the fourth DQ line DQ4, the first to third data latches DL1 to DL3 of a page buffer corresponding to the fourth DQ line DQ4 may be respectively set to values of "1", "1", and "0".

After a plurality of page buffers included in the page buffer circuit 130 are set as illustrated in FIG. 8, the nonvolatile memory device 100 may perform the program operation based on the page buffers thus set. For example, like a threshold voltage distribution diagram of FIG. 9, a plurality of memory cells connected with one word line WL may be programmed to have any one of the erase state "E" and first to fourth program states P1 to P4.

For example, memory cells corresponding to a page buffer in which all the first to third data latches DL1 to DL3 are set to "0" may have the erase state "E"; memory cells corresponding to a page buffer in which the first to third data latches DL1 to DL3 are respectively set to "1", "0", and "0" may have the first program state P1; memory cells corresponding to a page buffer in which the first to third data latches DL1 to DL3 are respectively set to "1", "0", and "1" may have the second program state P2; memory cells corresponding to a page buffer in which the first to third data latches DL1 to DL3 are respectively set to "1", "1", and "1" may have the third program state P3; and, memory cells corresponding to a page buffer in which the first to third data latches DL1 to DL3 are respectively set to "1", "1", and "0" may have the fourth program state P4.

In an example embodiment, as described above, values set to the first to third data latches DL1 to DL3 may be based on the DQ identifier DQID (however, there is excluded a state (i.e., the erase state "E") in which all the first to third data latches DL1 to DL3 are set to "0").

As described above, in the case where memory cells connected with one word line WL are programmed, memory cells (i.e., the first memory cells MC1 of FIG. 4) corresponding to the first DQ line DQ1 may have any one of the erase state "E" and the first program state P1, memory cells (i.e., the second memory cells MC2 of FIG. 4) corresponding to the second DQ line DQ2 may have any one of the erase state "E" and the second program state P2, memory cells (i.e., the third memory cells MC3 of FIG. 4) corresponding to the third DQ line DQ3 may have any one of the erase state "E" and the third program state P3, and memory cells (i.e., the fourth memory cells MC4 of FIG. 4) corresponding to the fourth DQ line DQ4 may have any one of the erase state "E" and the fourth program state P4. Accordingly, a memory cell may be programmed to have a different error margin based on a DQ line. In this example, though only a single bit having one of two bit values is being stored in memory cells connected to one word line WL, the memory cells may either be in an erase state "E," which represents a first bit value (e.g., "0"), or in one of four different program states, P1, P2, P3, or P4, where each of program states P1, P2, P3, and P4 represent the second bit value (e.g., "1").

In an example embodiment, in a program operation of memory cells, the first program state P1 may be verified based on a first verification voltage Vvfy1, the second program state P2 may be verified based on a second verification voltage Vvfy2 higher than the first verification voltage Vvfy1, the third program state P3 may be verified based on a third verification voltage Vvfy3 higher than the second verification voltage Vvfy2, and the fourth program state P4 may be verified based on a fourth verification voltage Vvfy4 higher than the third verification voltage Vvfy3.

In an example embodiment, memory cells programmed as illustrated in FIG. 9 may be read by using the same read voltage VRD. For example, in the nonvolatile memory device 100, states of memory cells may be determined while the read voltage VRD is applied to a word line WL. In this case, a memory cell having a threshold voltage higher than the read voltage VRD may be determined as storing a bit value of "1"; a memory cell having a threshold voltage lower than the read voltage VRD may be determined as storing a bit value of "0".

Figure 10:
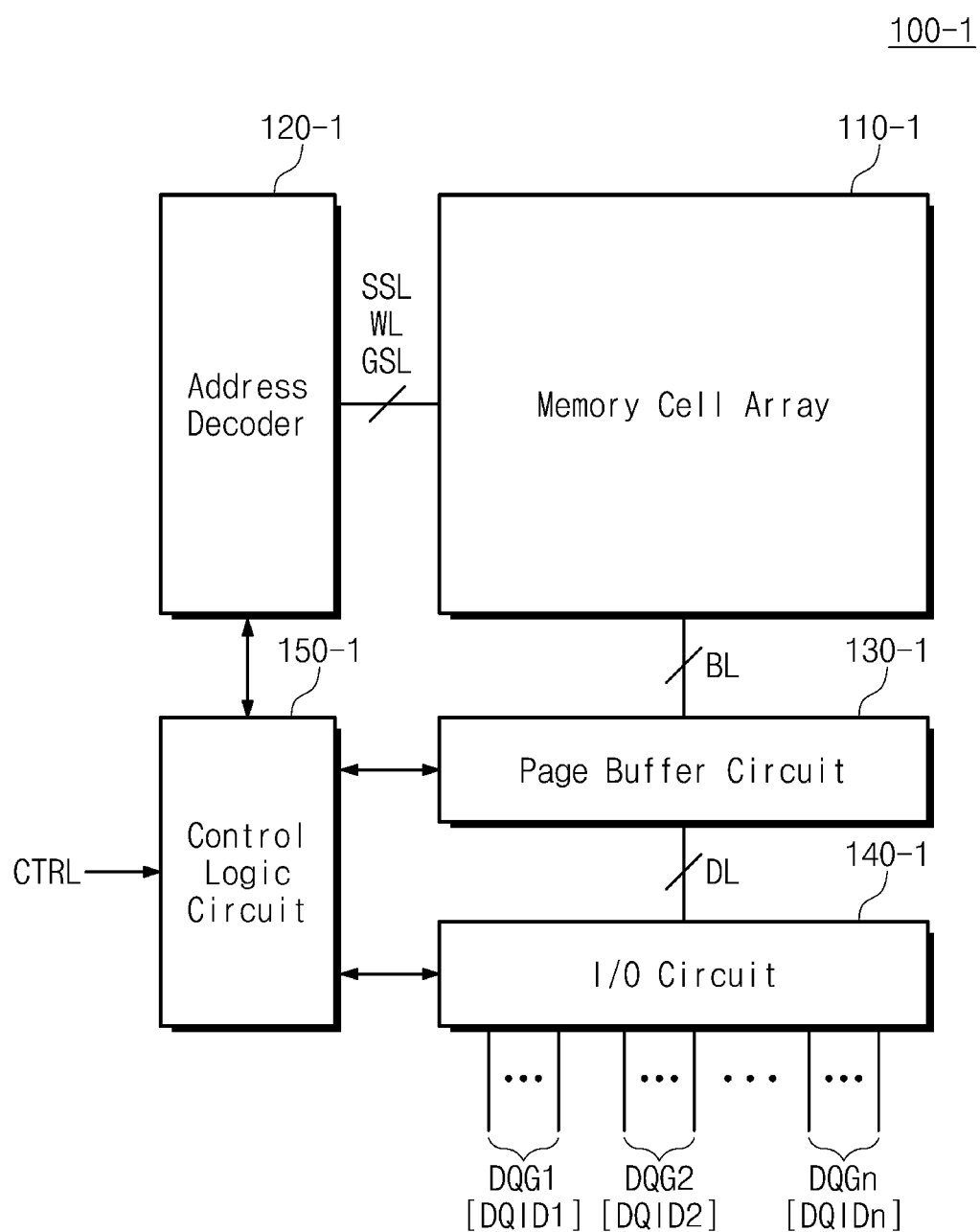
FIG. 10 is a block diagram illustrating an exemplary nonvolatile memory device of FIG. 1.

FIG. 10 is a block diagram illustrating a nonvolatile memory device of FIG. 1. Referring to FIG. 10, a nonvolatile memory device 100-1 may include a memory cell array 110-1, an address decoder 120-1, a page buffer circuit 130-1, an input/output circuit 140-1, and a control logic circuit 150-1. The memory cell array 110-1, the address decoder 120-1, the page buffer circuit 130-1, the input/output circuit 140-1, and the control logic circuit 150-1 are described above, and thus, additional description will be omitted to avoid redundancy.

The input/output circuit 140-1 of FIG. 10 may divide DQ lines into a plurality of DQ line groups DQG1 to DQGn for management. The DQ lines of the respective DQ line groups DQG1 to DQGn may correspond to different DQ identifiers DQID1 to DQIDn, respectively. For example, the DQ lines of the first DQ line group DQG1 may correspond to a first DQ identifier DQID1; the DQ lines of the second DQ line group DQG2 may correspond to a second DQ identifier DQID2; and, the DQ lines of the n-th DQ line group DQGn may correspond to an n-th DQ identifier DQIDn.

In an example embodiment, as described above, when a bit value of "1" is received through a DQ line, the nonvolatile memory device 100-1 may set a page buffer to a value of a DQ identifier corresponding to the DQ line. For example, when a bit value of "1" is received through a DQ line included in the first DQ line group DQG1, the nonvolatile memory device 100-1 may set a value of the first DQ identifier DQID1 to the page buffer corresponding to the first DQ line group DQG1.

As described above, the nonvolatile memory device 100-1 may manage a plurality of DQ lines in unit of a DQ line group and may give a different DQ identifier based on a DQ line group. As such, memory cells of respective DQ line groups may have different error margins.

Figure 11:
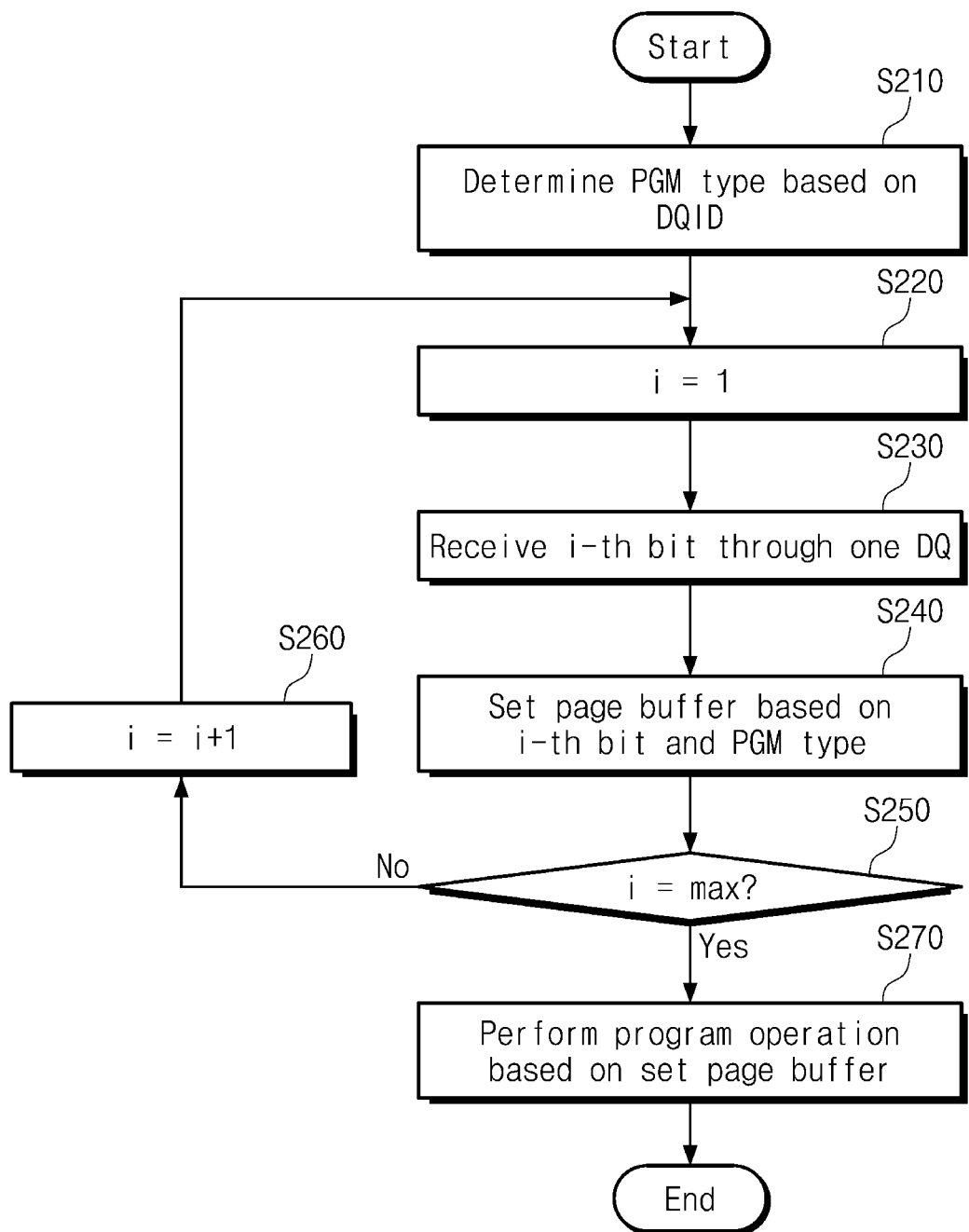
FIG. 11 is a flowchart illustrating an operation of the nonvolatile memory device of FIG. 2, according to some examples.
Figure 12:
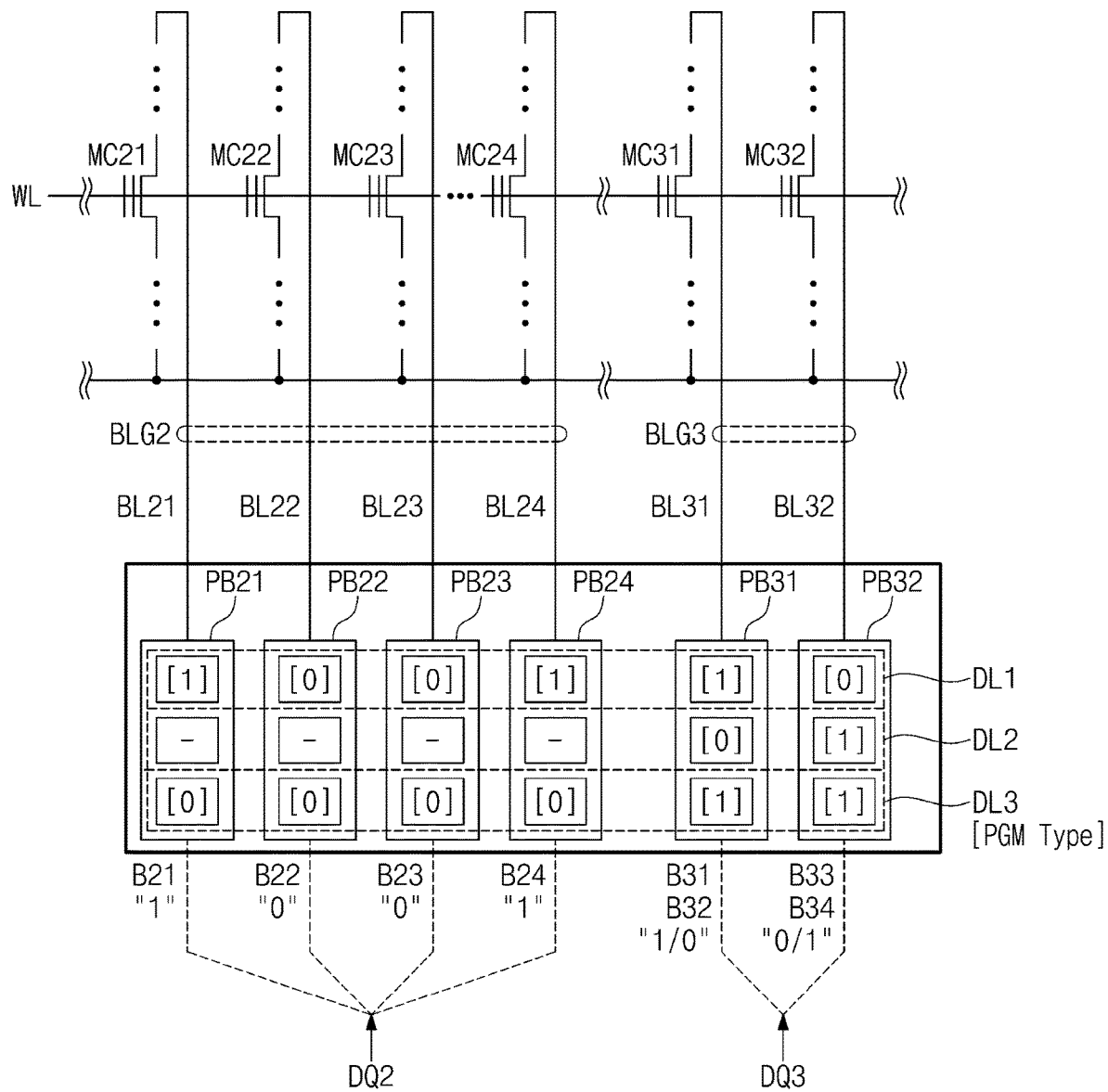
FIG. 12 is a diagram for describing an operation according to the flowchart of FIG. 11.
Figure 13A:
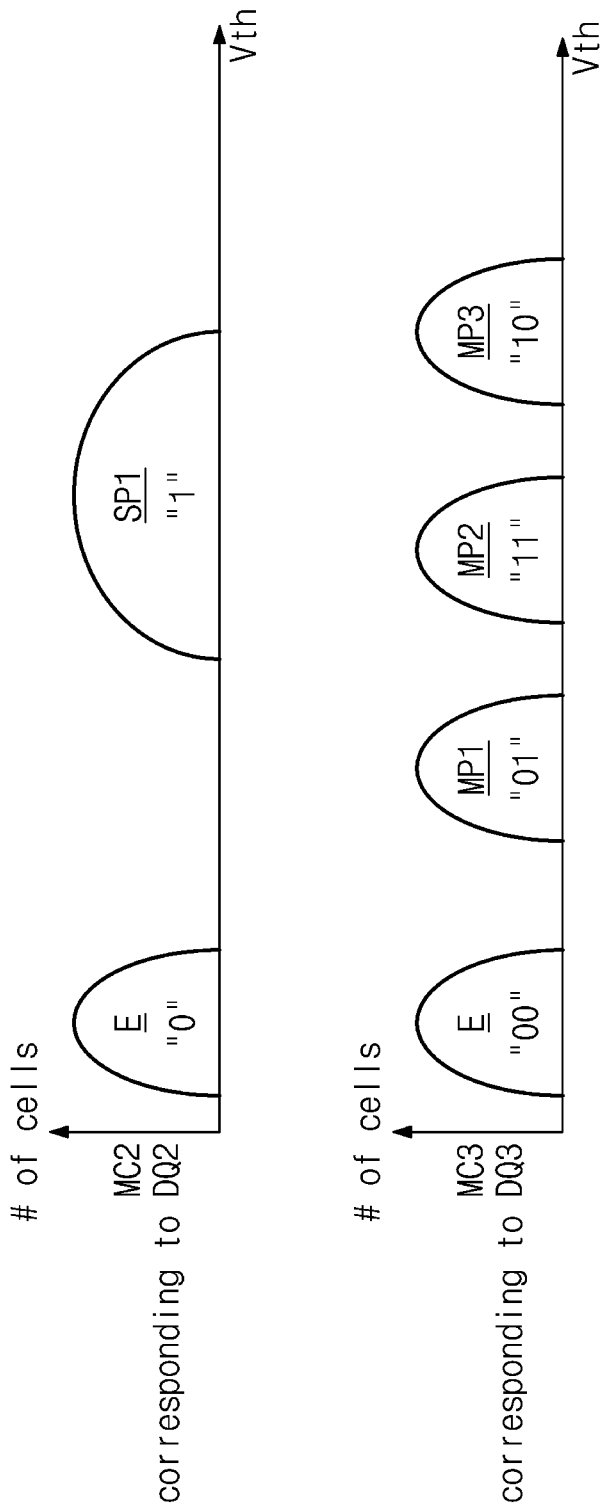
FIGS. 13A and 13B are distribution diagrams illustrating threshold voltage distributions of memory cells programmed according to the flowchart of FIG. 11.
Figure 13B:
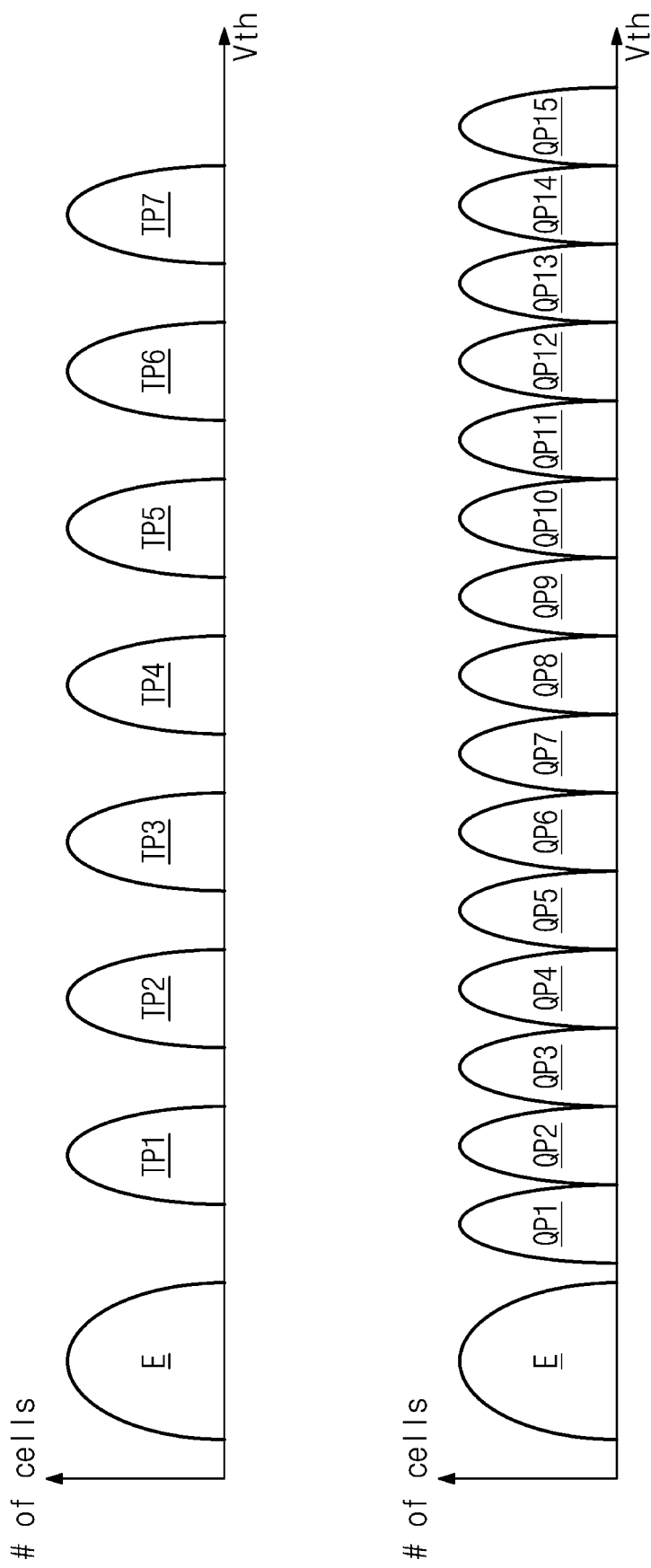

FIG. 11 is a flowchart illustrating an operation of the nonvolatile memory device of FIG. 2, according to some examples. FIG. 12 is a diagram for describing an operation according to the flowchart of FIG. 11. FIGS. 13A and 13B are distribution diagrams illustrating threshold voltage distributions of memory cells programmed according to the flowchart of FIG. 11.

In an example embodiment, an embodiment in which memory cells have different error margins based on DQ lines but stores 1-bit data identically will be described with reference to FIGS. 1 to 10. However, the inventive concept is not limited thereto. For example, each or a part of memory cells may be configured to store 2-bit data based on DQ lines.

For example, referring to FIGS. 2, 11, and 12, in operation S210, the nonvolatile memory device 100 may determine a program type based on a DQ identifier DQID. For example, the nonvolatile memory device 100 may determine a program type, such as a single-level cell ("SLC") program manner, or a multi-level cell ("MLC") program manner (which may store multiple bits per cell—for example, a triple-level cell ("TLC") program manner) with regard to memory cells corresponding to the DQ identifier DQID. Cells programmed to store different amounts of bits may be referred to generally herein as "m" bit cells (or storing "m" bits) or "n" bit cells (or storing "n" bits). In an example embodiment, the program type may be determined according to the number of bits stored per cell. For example, in the case where an SLC program manner is determined as the program type associated with the first DQ line DQ1, memory cells corresponding to the first DQ line DQ1 may be programmed in the SLC program manner of storing one bit per cell. In the case where an MLC program manner is determined as the program type associated with the second DQ line DQ2, memory cells corresponding to the second DQ line DQ2 may be programmed in the MLC program manner of storing two (or more) bits per cell.

Afterwards, the nonvolatile memory device 100 may perform operation S220 and operation S230. Operation S220 and operation S230 are similar to operation S110 and operation S120 of FIG. 6, and thus, additional description will be omitted to avoid redundancy.

In operation S240, the nonvolatile memory device 100 may set a page buffer based on a received i-th bit and a program type. For example, unlike the embodiment of FIGS. 1 to 10, the third data latch DL3 of each of the page buffers PB21, PB22, PB23, PB24, PB31, and PB32 may be used as a flag latch for storing information about a program type. For example, it is assumed that memory cells MC21, MC22, MC23, and MC24 corresponding to the second DQ line DQ2 are programmed in the SLC program manner and memory cells MC31 and MC32 corresponding to the third DQ line DQ3 are programmed in the MLC program manner. In this case, the third latches DL3 of the page buffers PB21, PB22, PB23, and PB24 corresponding to the second DQ line DQ2 may be set to "0", and the third latches DL3 of the page buffers PB31 and PB32 corresponding to the third DQ line DQ3 may be set to "1". That is, information of a relevant program type may be stored in the third latches DL3 of the page buffers PB21, PB22, PB23, PB24, PB31, and PB32.

In an example embodiment, as illustrated in FIG. 12, bits B21, B22, B23, and B24 having a value of "1001" may be sequentially received through the second DQ line DQ2. In this case, the bits B21, B22, B23, and B24 received through the second DQ line DQ2 may be respectively set to the first data latches DL1 of the page buffers PB21, PB22, PB23, and PB24. In this case, because the memory cells MC21, MC22, MC23, and MC24 corresponding to the second DQ line DQ2 are programmed in the SLC program manner, the second data latches DL2 of the page buffers PB21, PB22, PB23, and PB24 may not be separately set or may be ignored.

Bits B31, B32, B33, and B34 having a value of "1001" may be sequentially received through the third DQ line DQ3. In this case, the bits B31, B32, B33, and B34 received through the third DQ line DQ3 may be set to the first and second data latches DL1 and DL2 of the page buffers PB31 and PB32. For example, the bits B31 and B32 may be set to the first and second data latches DL1 and DL2 of the page buffer PB31, and the bits B33 and B34 may be set to the first and second data latches DL1 and DL2 of the page buffer PB32.

Afterwards, the nonvolatile memory device 100 may perform operation S250 and operation S260. Operation S250 and operation S260 may be similar to operation S160 and operation S170 of FIG. 6, and thus, additional description will be omitted to avoid redundancy.

In operation S270, the nonvolatile memory device 100 performs the program operation based on the set page buffers. For example, the nonvolatile memory device 100 may determine a program type based on the third data latch DL3 of a page buffer including information about the program type, and may program memory cells based on values stored in the first data latch DL1 and the second data latch DL2 of the page buffer in compliance with the determined program type.

For example, the memory cells (e.g., MC21, MC22, MC23, and MC24) corresponding to the second DQ line DQ2 described with reference to FIG. 12 may be SLC-programmed to have any one of the erase state "E" and a first SLC program state SP1. For example, memory cells (e.g., MC21 and MC24) corresponding to page buffers (e.g., PB21 and PB24) in which the third data latch DL3 including information about a program type is set to "0" and the first data latch DL1 is set to "1" may be SLC-programmed to have the first SLC program state SP1. Alternatively, memory cells (e.g., MC22 and MC23) corresponding to page buffers (e.g., PB22 and PB23) in which the third data latch DL3 is set to "0" and the first data latch DL1 is set to "0" may be SLC-programmed to have the erase state "E".

Memory cells (e.g., MC31 and MC32) corresponding to the third DQ line DQ3 may be MLC-programmed to have one of the erase state E and first to third MLC program states MP1 to MP3. In this example, memory cells corresponding to a page buffer (not illustrated) in which the third data latch DL3 including information about a program type is set to "1" and the first and second data latches DL1 and DL2 are set to "0" may be MLC-programmed to have the erase state "E". Alternatively, a memory cell (e.g., MC32) corresponding to a page buffer (e.g., PB32) in which the third data latch DL1 is set to "1", the first data latch DL1 is set to "0", and the second data latch DL2 is set to "1" may be MLC-programmed to have the first MLC program state MP1. In addition, memory cells corresponding to a page buffer (not illustrated) in which the third data latch DL3 is set to "1" and the first and data latches DL1 and DL2 are set to "1" may be MLC-programmed to have the second MLC program state MP2. A memory cell (e.g., MC31) corresponding to a page buffer (e.g., PB31) in which the third data latch DL1 is set to "1", the first data latch DL1 is set to "1", and the second data latch DL2 is set to "0" may be MLC-programmed to have the third MLC program state MP3.

In the above embodiment, the SLC program manner and a 2-bit per cell MLC program manner are described with regard to the second and third DQ lines DQ2 and DQ3, but the inventive concept is not limited thereto. For example, as illustrated in FIG. 13B, memory cells may be programmed in a TLC program manner or a QLC program manner based on a DQ identifier of a DQ line. In the case where memory cells corresponding to a specific DQ line (or a specific DQ identifier) are TLC-programmed, the memory cells may be programmed to have any one of the erase state "E" and first to seventh TLC program states TP1 to TP7 as illustrated in FIG. 13B. In this case, each memory cell may store 3-bit information.

In the case where memory cells corresponding to a specific DQ line (or a specific DQ identifier) are QLC-programmed, the memory cells may be programmed to have any one of the erase state "E" and first to fifteenth QLC program states QP1 to QP15 as illustrated in FIG. 13B. In this case, each memory cell may store 4-bit information.

In an example embodiment, in the case where each of specific memory cells corresponding to a specific DQ line stores n-bit data, each of page buffers respectively corresponding to the specific memory cells may include at least (n+1) or more data latches (e.g., "n" data latches configured to store "n" bits, respectively, and the other data latches configured to store information about a program type). Therefore, in some cases such as described above, where a first group of memory cells are programmed to store n-bit data, and a second group of memory cells are programmed to store m-bit data, where m is greater than n, a first page buffer corresponding to the first group of memory cells includes at least (n+1) data latches, and a second page buffer corresponding to the second group of memory cells includes at least (m+1) data latches.

As illustrated in FIGS. 13A and 13B, as the number of bits stored per cell decreases, an error margin (e.g., a difference between a lower limit value of a program state (e.g., P1, P2, P3, or P4) and a read voltage VRD below that program state) of a memory cell may increase. For example, the nonvolatile memory device 100 according to an embodiment of the inventive concept may allow memory cells to have different error margins based on DQ lines or DQ identifiers by applying different program manners to the memory cells based on the DQ lines or the DQ identifiers.

As can be seen from comparing FIGS. 6-9 and FIGS. 11-13B, in different embodiments, the same page buffer circuit can be used for a set of memory cells connected to a single word line, to allow the set of memory cells to be accessed (or, programmed) using different access (or, programming) schemes. For example, in one scheme, different memory cells connected to the same word line are programmed to store the same number of bits of data (e.g., a single bit), but have different respective error margins. In another scheme, memory cells connected to the same word line are programmed to store different numbers of bits of data (e.g., some store a single bit of data and some store multiple bits of data). In both cases, a DQ identifier, or DQ line code, associated with a memory cell may be used to determine the error margin between different program states for a group of memory cells that includes the memory cell. It should be noted that the error margin may refer to a minimum width or minimum threshold difference between two adjacent program states for a group of memory cells.

Figure 14:
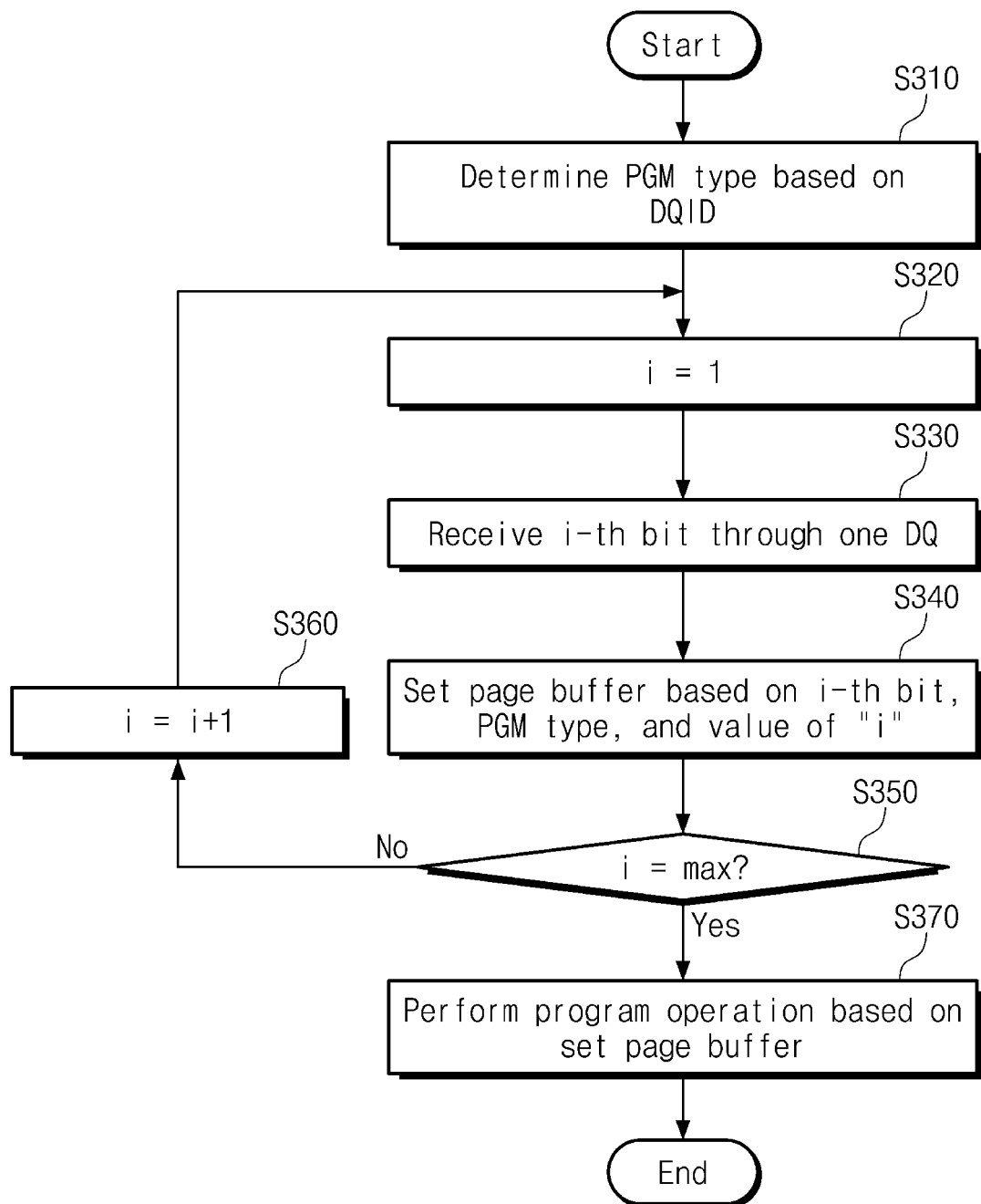
FIG. 14 is a flowchart illustrating an operation of a nonvolatile memory device of FIG. 2, according to some examples.
Figure 15:
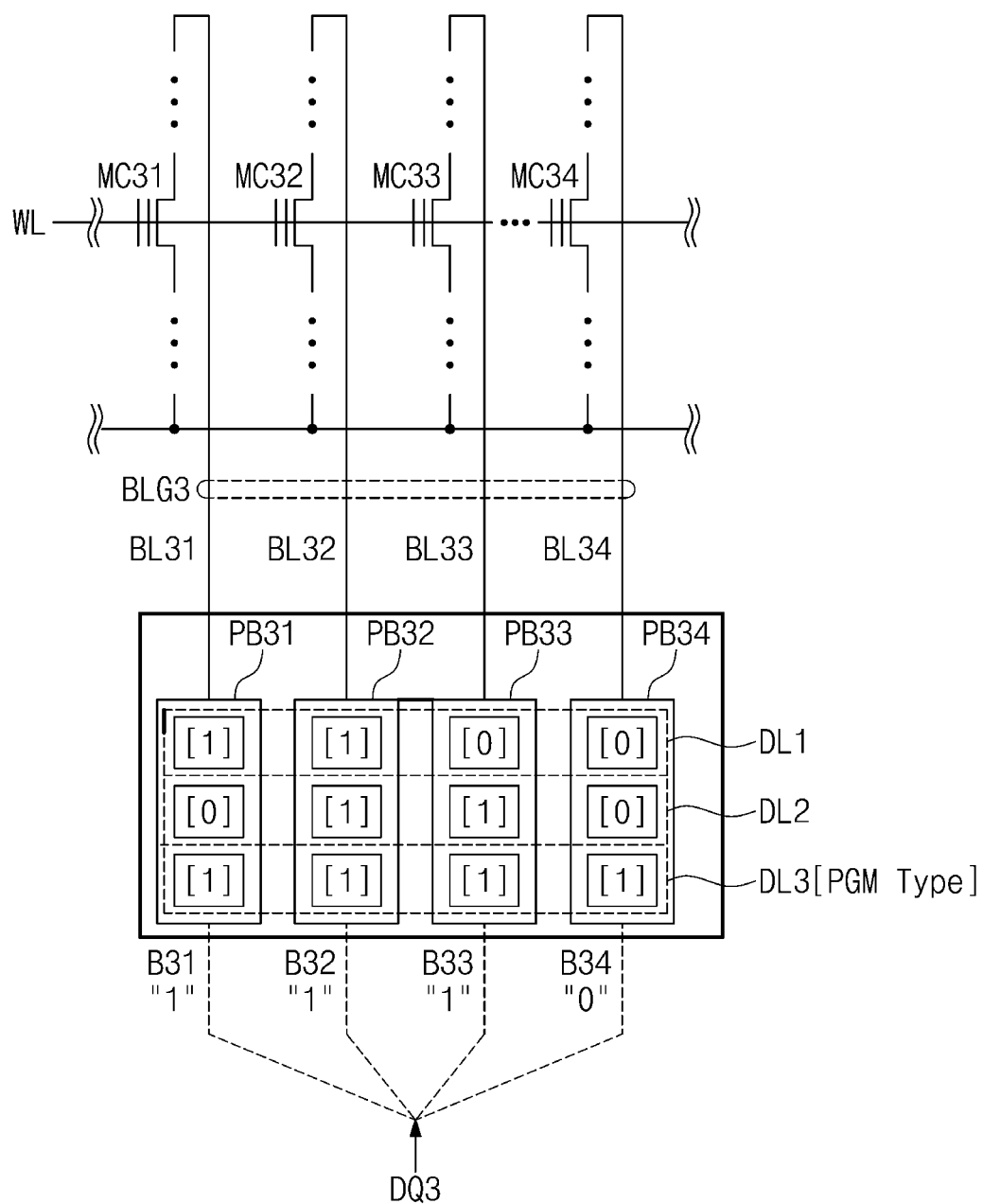
FIGS. 15 and 16 are diagrams for describing an operation according to the flowchart of FIG. 14.
Figure 16:
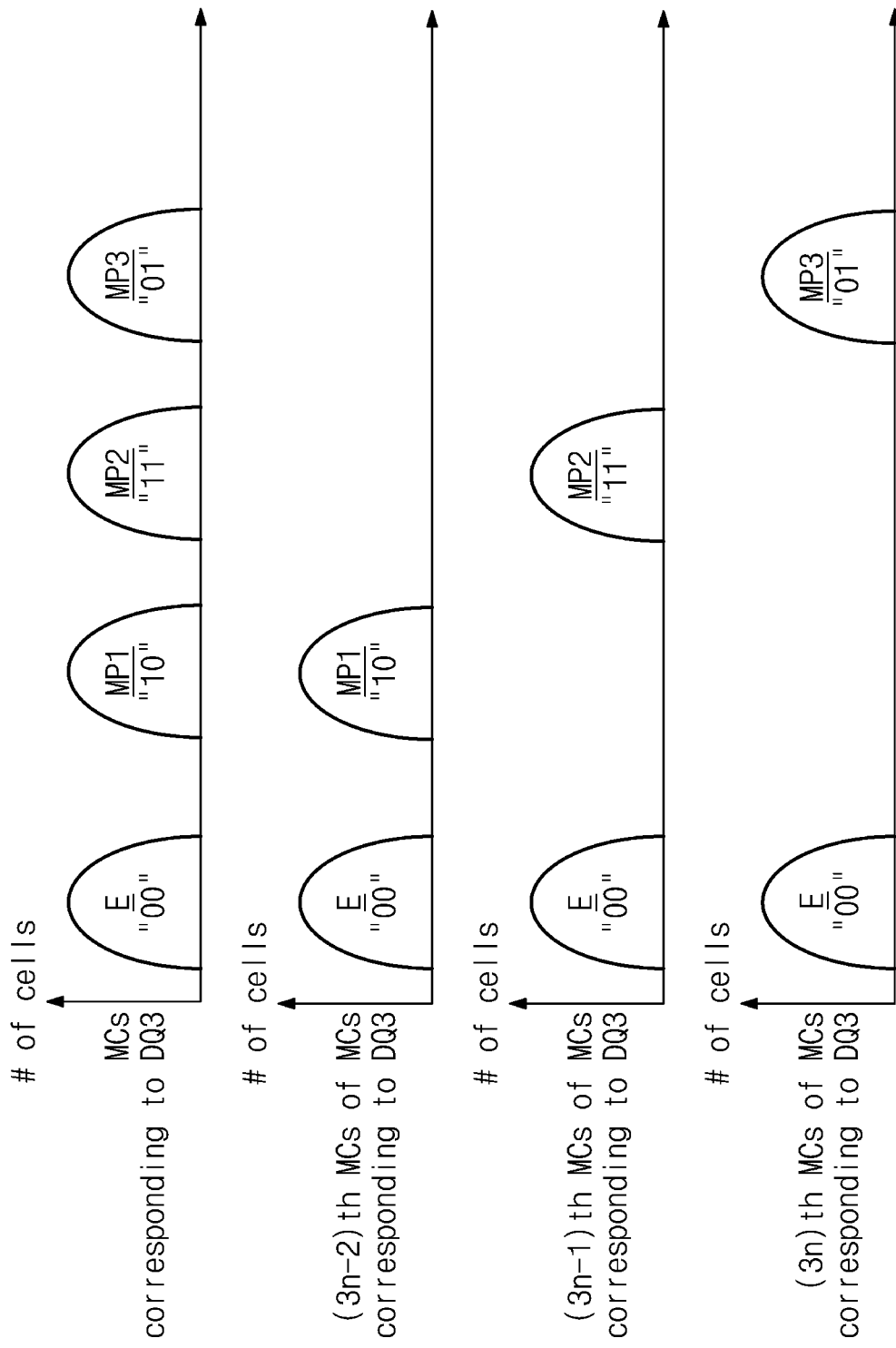

FIG. 14 is a flowchart illustrating an operation of a nonvolatile memory device of FIG. 2, according to some examples. FIGS. 15 and 16 are diagrams for describing an operation according to the flowchart of FIG. 14. Referring to FIGS. 2 and 14 to 16, the nonvolatile memory device 100 may perform operation S310 to operation S330. Operation S310 to operation S330 are similar to operation S210 to operation S230 of FIG. 11, and thus, additional description will be omitted to avoid redundancy.

In operation S340, the nonvolatile memory device 100 may set a page buffer based on a program type, an i-th bit, and a value of a variable "i". For example, as illustrated in FIG. 15, the nonvolatile memory device 100 may receive bits B31, B32, B33, and B34 through the third DQ line DQ3. A program manner associated with memory cells MC31, MC32, MC33, and MC34 corresponding to the third DQ line DQ3 may be determined as the MLC program manner. As such, as in the above description, the third data latches DL3 of the page buffers PB31, PB32, PB33, and PB34 corresponding to the third DQ line DQ3 may be set to "1".

In this case, values of the page buffers PB31, PB32, PB33, and PB34 may be set according to a value of received bits and an order of each received bit. For example, in the embodiment described with reference to FIG. 12, for the MLC program operation, a combination of two bits is provided to one page buffer.

In contrast, in the embodiment of FIG. 15, the first and second data latches DL1 and DL2 of the page buffers PB31, PB32, PB33, and PB34 may be set according to one bit received through the third DQ line DQ3 and an order of the received bit. For example, in the case where the bit B31 first received through the third DQ line DQ3 is "1", the first and second data latches DL1 and DL2 of the page buffer PB31 may be respectively set to "1" and "0" such that the memory cell MC31 corresponding to the page buffer PB31 has the first MLC program state MP1 illustrated in FIG. 16. In the case where the bit B32 next received through the third DQ line DQ3 is "1", the first and second data latches DL1 and DL2 of the page buffer PB32 may be respectively set to "1" and "1" such that the memory cell MC32 corresponding to the page buffer PB32 has the second MLC program state MP2 illustrated in FIG. 16. In the case where the bit B33 then received through the third DQ line DQ3 is "1", the first and second data latches DL1 and DL2 of the page buffer PB33 may be respectively set to "0" and "1" such that the memory cell MC33 corresponding to the page buffer PB33 has the third MLC program state MP3 illustrated in FIG. 16. In the case where the bit B34 finally received through the third DQ line DQ3 is "0", the first and second data latches DL1 and DL2 of the page buffer PB34 may be respectively set to "0" and "0" such that the memory cell MC34 corresponding to the page buffer PB34 has the erase state "E" illustrated in FIG. 16.

As described above, the nonvolatile memory device 100 may set a page buffer based on a value of a received one bit, an order in which the one bit is received, and a program type.

Afterwards, the nonvolatile memory device 100 may perform operation S350 to operation S370. Operation S350 to operation S370 are similar to operation S250 to operation S270 of FIG. 11, and thus, additional description will be omitted to avoid redundancy.

In an example embodiment, memory cells corresponding to the third DQ line DQ3 among memory cells programmed according to the flowchart of FIG. 14 may have threshold voltage distributions illustrated in FIG. 16. For example, memory cells corresponding to the third DQ line DQ3 may have any one of the erase state "E" and the first to third MLC program states MP1 to MP3. However, (3n−2)-th memory cells ("n" being a natural number) of the memory cells corresponding to the third DQ line DQ3 may have any one of the erase state "E" and the first MLC program state MP1; (3n−1)-th memory cells of the memory cells corresponding to the third DQ line DQ3 may have any one of the erase state "E" and the second MLC program state MP2; and, 3n-th memory cells of the memory cells corresponding to the third DQ line DQ3 may have any one of the erase state "E" and the third MLC program state MP3.

The above-described order of the memory cells is exemplary, and the inventive concept is not limited thereto. Also, an order of memory cells may be a physical or logical order.

In the above embodiments of the inventive concept, the detailed descriptions such as a configuration of a page buffer, the number of data latches, the number of bits stored per cell, and a correspondence relationship between a data latch value and a threshold voltage distribution may be simple examples, and the inventive concept is not limited thereto. The above embodiments may be variously changed or modified by an ordinary one without departing from the technical idea of the inventive concept.

As described above, according to embodiments of the inventive concept, a nonvolatile memory device may differently set error margins of memory cells in various manners based on DQ lines (or DQ identifiers). In this case, because the probability that an error occurs in data output through a specific DQ line decreases, a burden associated with error correction may decrease. Accordingly, a nonvolatile memory device with improved reliability and improved performance and an operation method thereof are provided.

Figure 17:
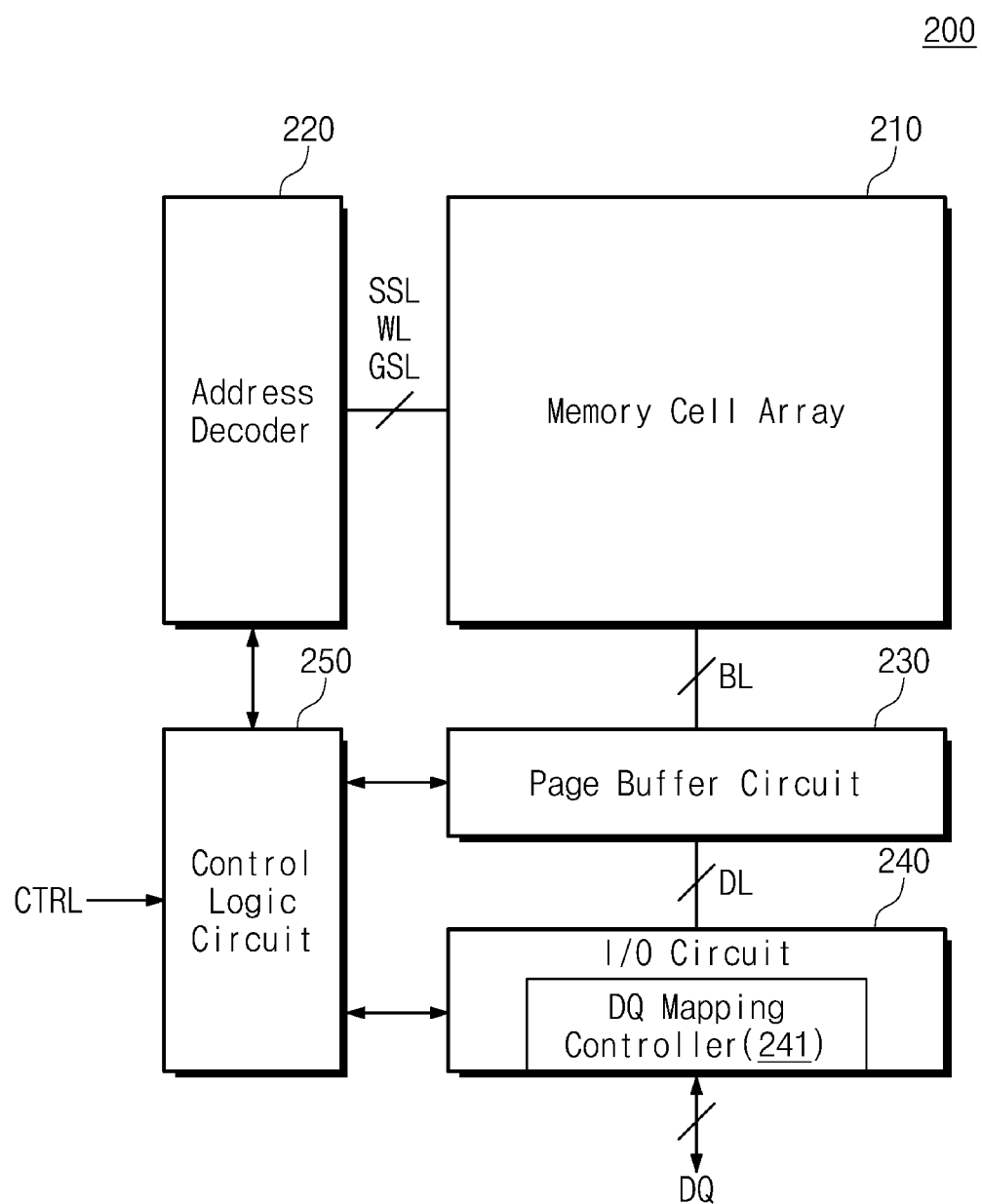
FIG. 17 is a block diagram illustrating a nonvolatile memory device according to an embodiment of the inventive concept.

FIG. 17 is a block diagram illustrating a nonvolatile memory device according to an embodiment of the inventive concept. Referring to FIG. 17, a nonvolatile memory device 200 may include a memory cell array 210, an address decoder 220, a page buffer circuit 230, an input/output circuit 240, and a control logic circuit 250. In an example embodiment, the nonvolatile memory device 200 of FIG. 17 may perform the program operation such that memory cells corresponding to a DQ line have different error margins, as described with reference to FIGS. 1 to 16. The memory cell array 210, the address decoder 220, the page buffer circuit 230, and the control logic circuit 250 are described with reference to FIGS. 1 to 15, and thus, additional description will be omitted to avoid redundancy.

The input/output circuit 240 of FIG. 17 may include a DQ remapping controller 241. The DQ remapping controller 241 may be configured to control a mapping relationship or a correspondence relationship between DQ lines DQ and data lines DL. For example, as described with reference to FIG. 4, the first to fourth DQ lines DQ1 to DQ4 may correspond to the data line groups DLG1 to DLG4, respectively. Data received through the fourth DQ line DQ4 may be stored in fourth memory cells MC4 corresponding to the fourth data line group DLG4. In this case, as described above, because the fourth memory cells MC4 are programmed to have a relatively high threshold voltage, the fourth memory cells MC4 may experience a lot of deterioration compared with the other memory cells (e.g., MC1, MC2, and MC3). In this case, the reliability of data stored in memory cells may decrease.

As described above, to compensate for a deterioration difference of memory cells, the DQ remapping controller 241 may adjust the mapping relationship or the correspondence relationship between the DQ lines DQ and the data lines DL periodically or when a specific condition is satisfied. As such, it may be possible to compensate for a deterioration difference of memory cells.

Figure 18:
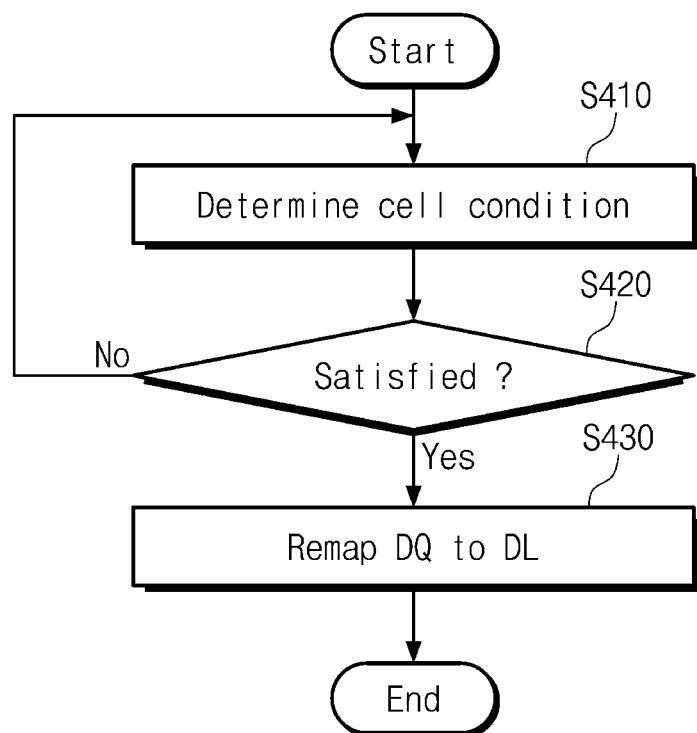
FIG. 18 is a flowchart illustrating a DQ mapping operation of a nonvolatile memory device of FIG. 17.
Figure 19A:
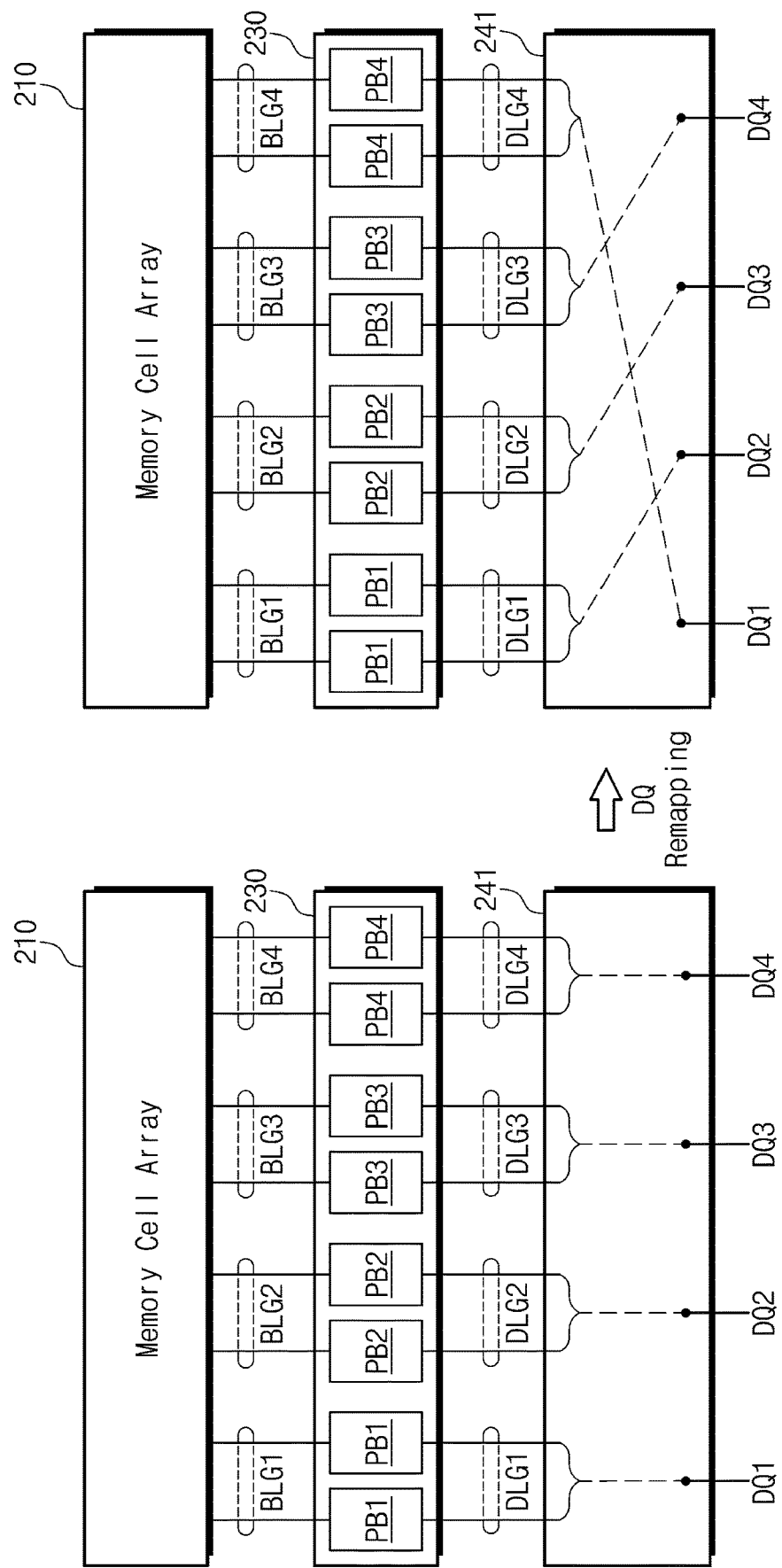
FIGS. 19A and 19B are diagrams for describing a DQ mapping operation according to the flowchart of FIG. 17.
Figure 19B:
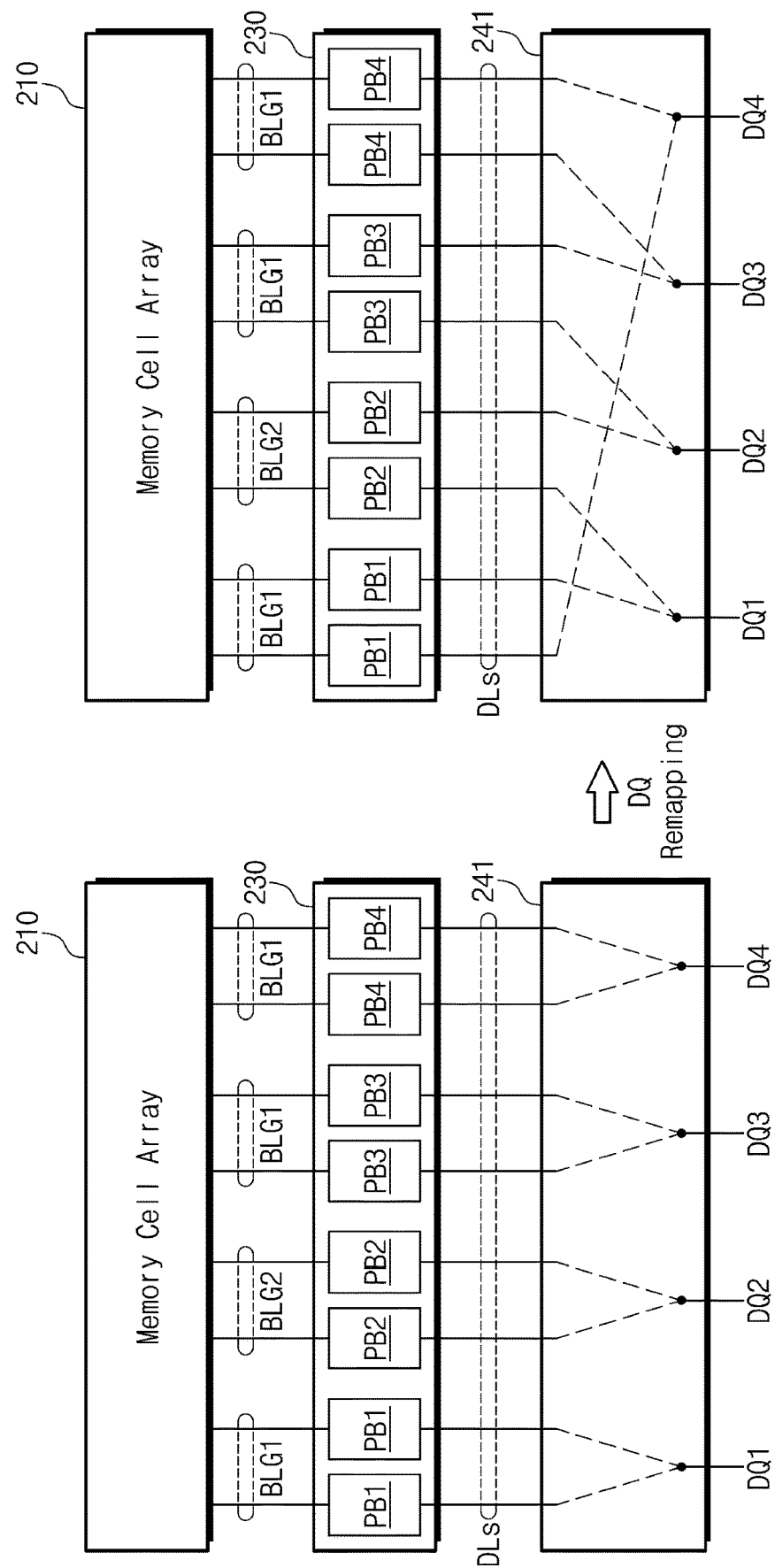

FIG. 18 is a flowchart illustrating a DQ mapping operation of a nonvolatile memory device of FIG. 17. FIGS. 19A and 19B are diagrams for describing a DQ mapping operation according to the flowchart of FIG. 17.

Referring to FIGS. 17 and 18, in operation S410, the nonvolatile memory device 200 may determine a cell condition. In an example embodiment, the cell condition may indicate various factors capable of determining the degree of deterioration of memory cells. For example, the cell condition may include various information such as P/E cycle information of the nonvolatile memory device 200, information about the number of errors of data read from memory cells of the nonvolatile memory device 200, and temperature information of the nonvolatile memory device 200.

In operation S420, the nonvolatile memory device 200 may determine whether the determined cell condition satisfies a specific condition. For example, the nonvolatile memory device 200 may determine whether a P/E cycle count reaches a specific count. Alternatively, the nonvolatile memory device 200 may determine whether the number of errors included in data read from memory cells is not smaller than a specific value.

When the cell condition does not satisfy the specific condition, the nonvolatile memory device 200 may not perform a separate operation. When the cell condition satisfies the specific condition, in operation S430, the nonvolatile memory device 200 may remap the correspondence relationship between the DQ lines DQ and the data lines DL.

For example, referring to FIGS. 19A and 19B, the nonvolatile memory device 200 may include the memory cell array 210, the page buffer circuit 230, and the DQ remapping controller 241, and the page buffer circuit 230 may include a plurality of page buffers PB1 to PB4. Components illustrated in FIGS. 19A and 19B and a connection relationship between the components are described above, and thus, additional description will be omitted to avoid redundancy.

As described with reference to FIG. 19A, the first to fourth DQ lines DQ1 to DQ4 may correspond to the first to fourth data line groups DLG1 to DLG4, respectively. That is, data received through the first DQ line DQ1 are provided to the first page buffers PB1 connected with the first data line group DLG1; data received through the second DQ line DQ2 are provided to the second page buffers PB2 connected with the second data line group DLG2; data received through the third DQ line DQ3 are provided to the third page buffers PB3 connected with the third data line group DLG3; and, data received through the fourth DQ line DQ4 are provided to the fourth page buffers PB4 connected with the fourth data line group DLG4. The data stored or latched in the first to fourth page buffers PB1 to PB4 may be stored in corresponding memory cells of the memory cell array 210.

Here, in the case where a cell condition of memory cells of the memory cell array 210 satisfies a specific condition (e.g., in the case where a P/E cycle count reaches a reference value), the DQ remapping controller 241 may adjust a correspondence relationship between the first to fourth DQ lines DQ1 to DQ4 and the first to fourth data line groups DLG1 to DLG4.

For example, a remapping operation may be performed by the DQ remapping controller 241 such that the first DQ line DQ1 corresponds to the fourth data line group DLG4, the second DQ line DQ2 corresponds to the first data line group DLG1, the third DQ line DQ3 corresponds to the second data line group DLG2, and the fourth DQ line DQ4 corresponds to the third data line group DLG3.

For example, after the DQ remapping operation is performed, data received through the first DQ line DQ1 may be provided to the fourth page buffers PB4 connected with the fourth data line group DLG4; data received through the second DQ line DQ2 may be provided to the first page buffers PB1 connected with the first data line group DLG1; data received through the third DQ line DQ3 may be provided to the second page buffers PB2 connected with the second data line group DLG2; and, data received through the fourth DQ line DQ4 may be provided to the third page buffers PB3 connected with the third data line group DLG3.

Assuming that memory cells corresponding to the fourth DQ line DQ4 have the greatest error margin and memory cells corresponding to the first DQ line DQ1 have the smallest error margin, deterioration of the memory cells corresponding to the fourth page buffer PB4 before the DQ remapping operation may be relatively great, while deterioration of the memory cells corresponding to the fourth page buffer PB4 after the DQ remapping operation may decrease relatively. Accordingly, because the degree of deterioration of all memory cells of the nonvolatile memory device 200 are leveled, the reliability of the nonvolatile memory device 200 is improved.

In the embodiment of FIG. 19A, a description is given as the DQ remapping controller 241 controls a correspondence relationship between DQ lines and data line groups, but the inventive concept is not limited thereto. For example, as illustrated in FIG. 19B, the DQ remapping operation may be performed in the unit of a data line.

For example, as illustrated in FIG. 19B, the first DQ line DQ1 may correspond to data lines connected with the first page buffers PB1 before the DQ remapping operation; however, after the DQ remapping operation of the DQ remapping controller 241, the first DQ line DQ1 may correspond to data lines connected with a part of the first page buffers PB1 and data lines connected with a part of the second page buffers PB2. That is, the DQ remapping controller 241 may perform the DQ remapping operation in the unit of a data line.

The embodiments of the inventive concept above described are simple examples to describe the technical idea of the inventive concept easily, and the inventive concept is not limited thereto.

Figure 20A:
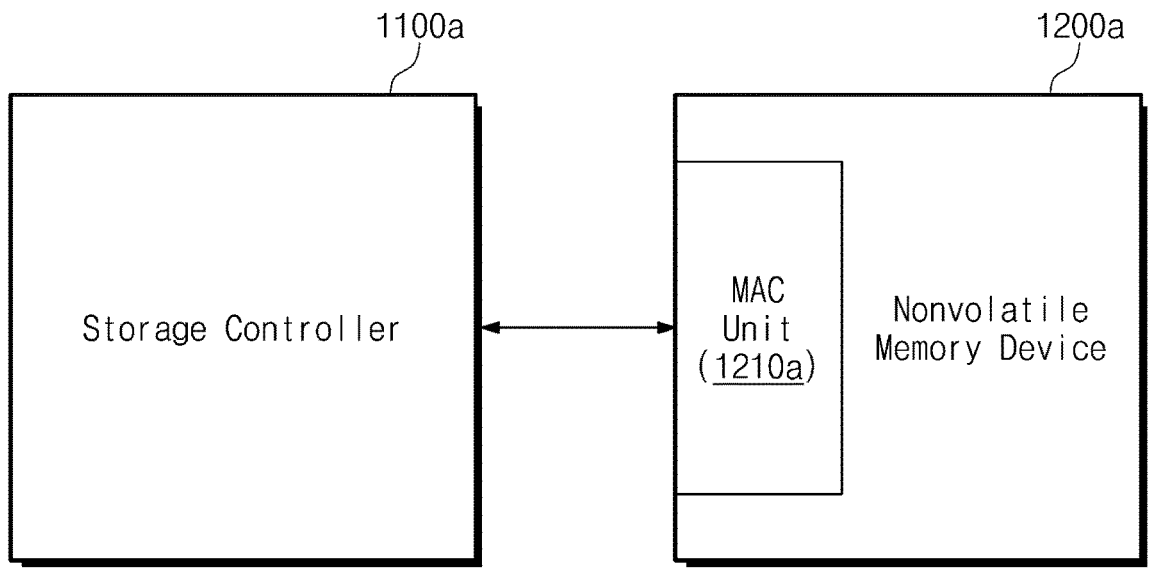
FIGS. 20A to 20D are block diagrams illustrating a storage device to which a nonvolatile memory module according to an embodiment of the inventive concept is applied.

FIGS. 20A to 20D are block diagrams illustrating a storage device to which a nonvolatile memory module according to an embodiment of the inventive concept is applied. Referring to FIG. 20A, a storage device 1000a may include a storage controller 1100a and a nonvolatile memory device 1200a.

The storage controller 1100a may exchange data with the nonvolatile memory device 1200a. The nonvolatile memory device 1200a may include a multiply accumulate (MAC) unit 1210a. The MAC unit 1210a may be configured to perform an MAC operation on data stored in the nonvolatile memory device 1200a. For example, the MAC operation may include a calculation operation, which is used in various applications, such as machine learning or artificial intelligence. The nonvolatile memory device 1200a may store weight information used for the various applications, and the MAC unit 1210a may perform the MAC operation on the weight information and may provide a result of the MAC operation to the storage controller 1100a.

The nonvolatile memory device 1200a may be nonvolatile memory devices described with reference to FIG. 1 to 19B or may operate similarly to the nonvolatile memory devices. For example, DQ lines of the nonvolatile memory device 1200a may be connected with the MAC unit 1210, and the MAC unit 1210a may perform the MAC operation on weight information received through the DQ lines.

In this case, as described above, because the nonvolatile memory device 1200a may differently set error margins of memory cells based on DQ lines, data corresponding to a specific DQ line among data input to the MAC unit 1210 may have higher reliability than data corresponding to any other DQ line. For example, a set of data received through DQ lines during one cycle may be a bit vector. In the case where an error occurs in a most significant bit (MSB) of the bit vector, an error present in a result value of the MAC unit 1210a may be greater than in the case where an error occurs in other bits (e.g., a least significant bit (LSB)). For example, as the nonvolatile memory device 1200a makes an error margin of a DQ line corresponding to an MSB of the bit vector great, the reliability of calculation of the MAC unit 1210a may be improved.

Figure 20B:
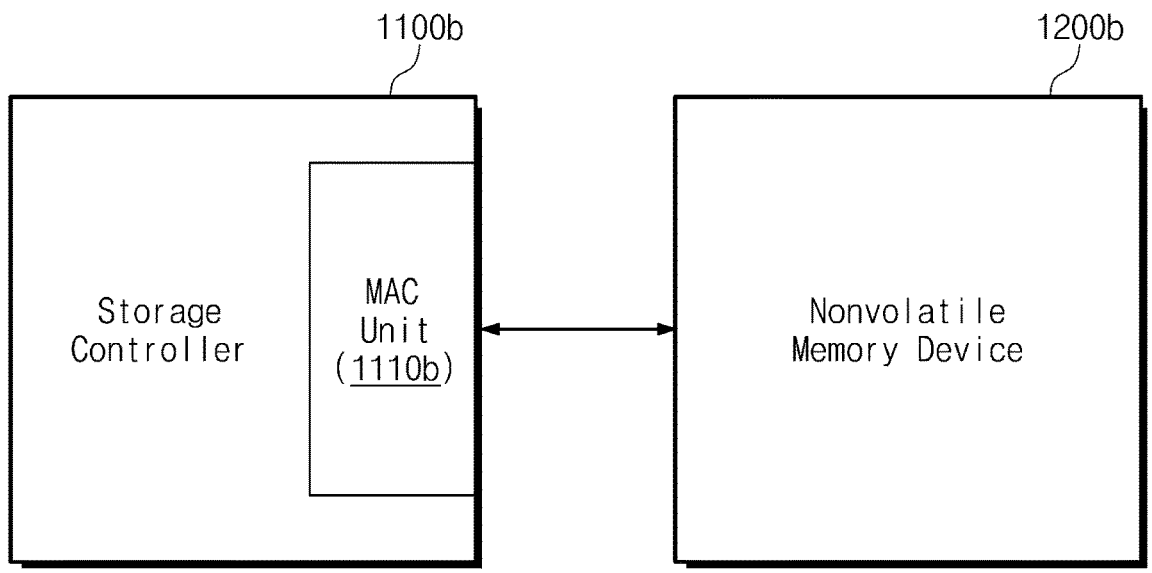

Referring to FIG. 20B, a storage device 1000b may include a storage controller 1100b and a nonvolatile memory device 1200b. The storage controller 1100b may include an MAC unit 1110b. The nonvolatile memory device 1200b may be a nonvolatile memory device described with reference to FIG. 1 to 19B or may operate according to an operation method described with reference to FIGS. 1 to 19B.

The storage device 1000b of FIG. 20B is similar to the storage device 1000a of FIG. 20A except that the MAC unit 1110b is included in the storage controller 1100b, and thus, additional description will be omitted to avoid redundancy.

Figure 20C:
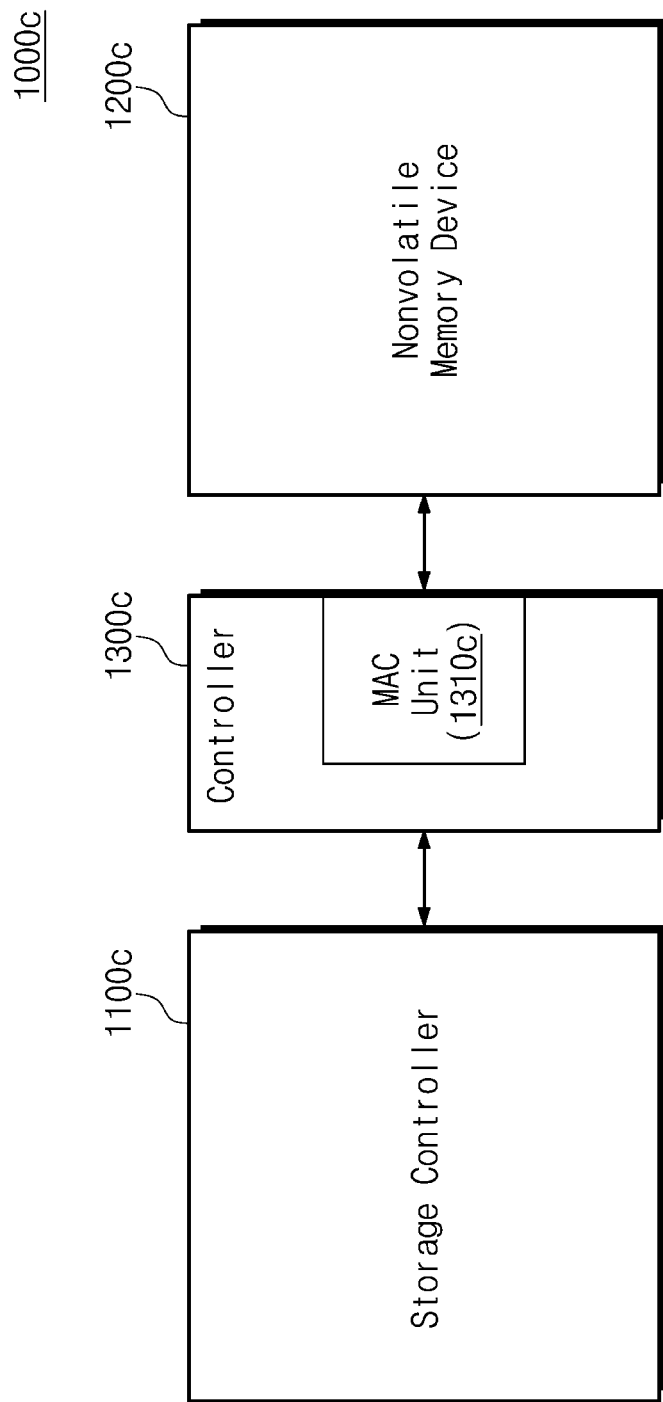

Referring to FIG. 20C, a storage device 1000c may include a storage controller 1100c, a nonvolatile memory device 1200c, and a controller 1300c. The controller 1300c may include an MAC unit 1310c. The nonvolatile memory device 1200c may be a nonvolatile memory device described with reference to FIG. 1 to 19B or may operate according to an operation method described with reference to FIGS. 1 to 19B.

The storage device 1000c of FIG. 20C is similar to the storage devices 1000a and 1000b except that the MAC unit 1110c is included in the separate controller 1300c, and thus, additional description will be omitted to avoid redundancy.

Figure 20D:
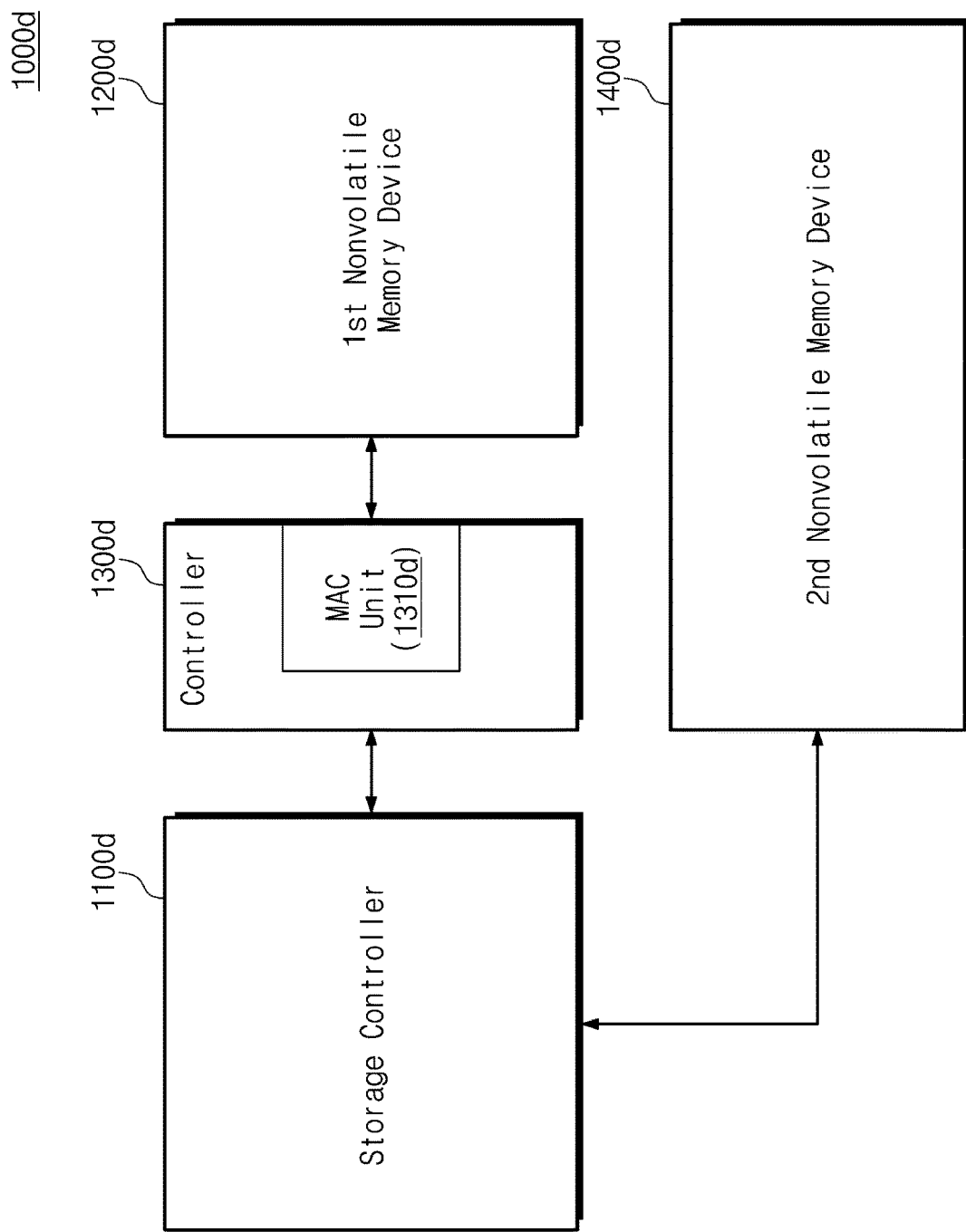

Referring to FIG. 20D, a storage device 1000d may include a storage controller 1100d, a first nonvolatile memory device 1200d, a controller 1300d, and a second nonvolatile memory device 1400d. The controller 1300d may include an MAC unit 1310d.

The nonvolatile memory device 1200d may be a nonvolatile memory device described with reference to FIG. 1 to 19B or may operate according to an operation method described with reference to FIGS. 1 to 19B.

The storage controller 1100d may be configured to communicate with the controller 1300d or the second nonvolatile memory device 1400d based on an operating situation. For example, the second nonvolatile memory device 1400d may be a high-capacity storage medium configured to store user data. In response to a request of an external device (e.g., a host or an application processor (AP)), the storage controller 1100d may read data stored in the second nonvolatile memory device 1400d or may store data in the second nonvolatile memory device 1400d.

The storage controller 1100d may control the controller 1300d for the purpose of performing a specific function (e.g., an artificial intelligence function), and the controller 1300d may be configured to perform the specific function under control of the storage controller 1100d.

As described above, according to embodiments of the inventive concept, a nonvolatile memory device may differently set error margins of memory cells based on DQ lines. In this case, the reliability of data exchanged through a specific DQ line may increase. For example, in a MAC operation, in the case where an error of a specific bit has an influence on a calculation operation, the nonvolatile memory device according to an embodiment of the inventive concept may provide improved reliability and improved performance.

Figure 21:
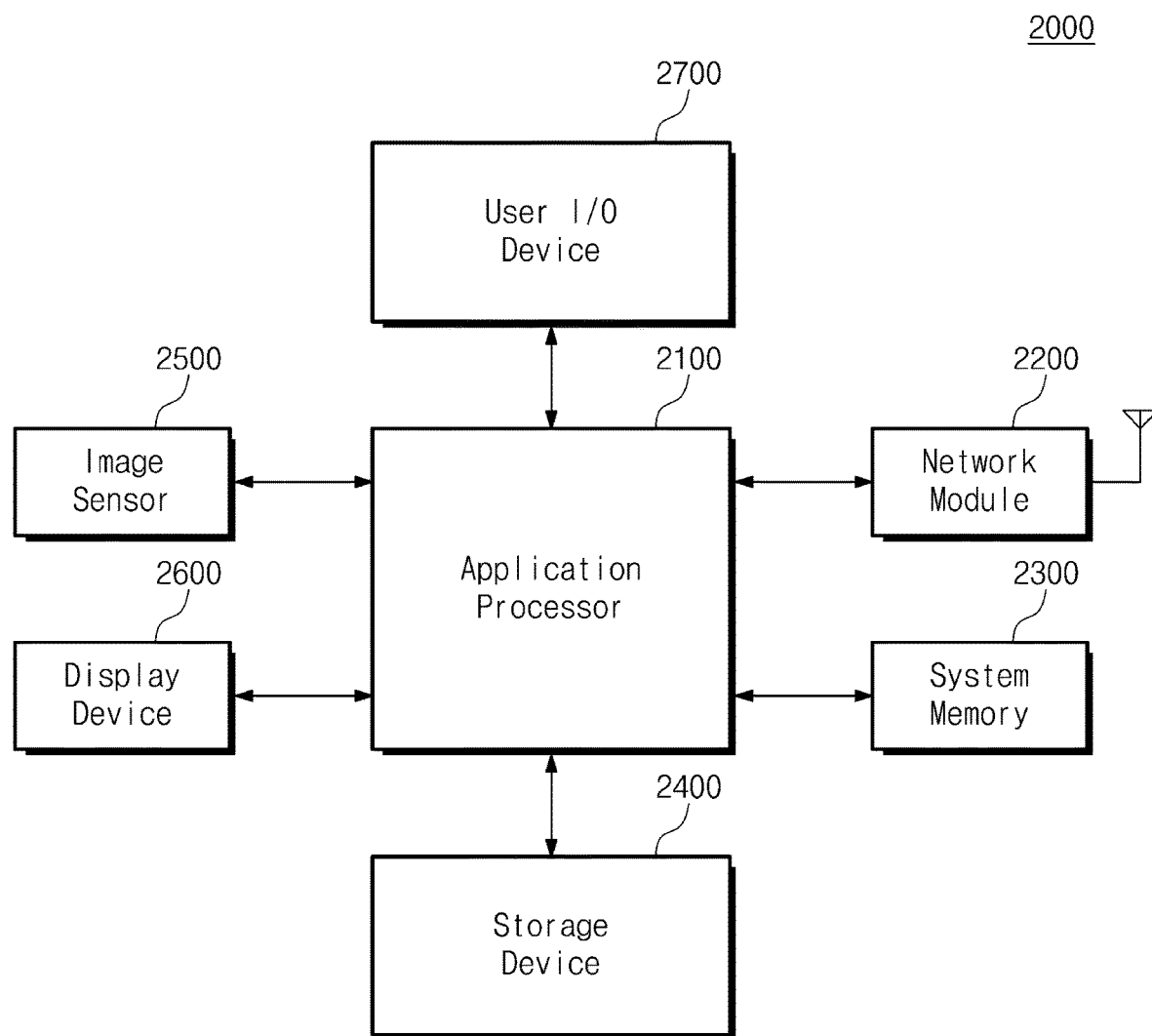
FIG. 21 is a block diagram illustrating a mobile system to which a nonvolatile memory device according to an embodiment of the inventive concept is applied.

FIG. 21 is a block diagram illustrating a mobile system to which a nonvolatile memory device according to an embodiment of the inventive concept is applied. Referring to FIG. 21, a mobile system 2000 may include an application processor 2100, a network module 2200, a system memory 2300, a storage device 2400, an image device 2500, a display device 2600, and a user input/output device 2700. In an example embodiment, the mobile system 2000 may be a portable computing system such as a smartphone, a tablet personal computer (PC), or a notebook.

The application processor 2100 (e.g., an application processor (AP)) may control overall operations of the mobile system 2000. The network module 2200 may provide wireless or wired communication with an external device (e.g., a base station, a server, or any other mobile device). The system memory 2300 may be used as a working memory or a buffer memory of the mobile system 2000. In an example embodiment, the system memory 2300 may be a memory (e.g., a DRAM) supporting a high-speed operation.

The storage device 2400 may be used as a high-capacity storage medium for storing various information used in the mobile system 2000. In an example embodiment, the storage device 2400 may be a nonvolatile memory device described with reference to FIG. 1 to 19B or may operate based on a method described with reference to FIGS. 1 to 19B.

The display device 2600 may be a device displaying information processed by the application processor 2100 to a user. The image sensor 2500 may be a device collecting image information associated with an external subject. The user input/output device 2700 may be a device, which receives a command from a user or provides information, such as a microphone, a speaker, a keypad, or a touch screen display.

According to embodiments of the inventive concept, a nonvolatile memory device may differently set error margins of memory cells based on DQ lines. Accordingly, a nonvolatile memory device with improved reliability and improved performance and an operation method thereof are provided.

While the inventive concept has been described with reference to example embodiments thereof, it will be apparent to those of ordinary skill in the art that various changes and modifications may be made thereto without departing from the spirit and scope of the invention is defined as set forth in the following claims.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

It will be understood that when an element is referred to as being "connected" or "coupled" to or with another element, it can be directly connected or coupled to the other element or intervening elements may be present. Circuit components described as connected to other components in connection with circuit diagrams are in electrical communication with those other components.

What is claimed is:

1. An operation method of a nonvolatile memory device, the method comprising:
receiving a plurality of first DQ signals representing a plurality of first data bits from an external device through a first DQ line and receiving a plurality of second DQ signals representing a plurality of second data bits from the external device through a second DQ line; and
programming a plurality of first memory cells corresponding to the first DQ line and a plurality of second memory cells corresponding to the second DQ line such that each of the first memory cells has one of an erase state and a first program state based on a respective first DQ signal and each of the second memory cells has one of the erase state and a second program state based on a respective second DQ signal,
wherein a lower limit value of a threshold voltage distribution corresponding to the second program state associated with the plurality of second memory cells is higher than a lower limit value of a threshold voltage distribution corresponding to the first program state associated with the plurality of first memory cells,
wherein the plurality of first memory cells and the plurality of second memory cells are connected to the same word line, and
wherein the erase state for each of the first memory cells and for each of the second memory cells represents the same data state, and the first program state for the first memory cells and the second program state for the second memory cells both represent the same data state.

2. The method of claim 1, wherein each memory cell of the first memory cells and the second memory cells stores 1-bit data.

3. The method of claim 1, wherein the programming includes:
setting a first page buffer corresponding to one first memory cell to a value corresponding to the erase state when one first DQ signal representing one first data bit has a first value and setting the first page buffer to a value corresponding to a first DQ identifier for the first DQ line when the one first DQ signal representing the one first data bit has a second value;

setting a second page buffer corresponding to one second memory cell to the value corresponding to the erase state when one second DQ signal representing one second data bit has the first value and setting the second page buffer to a value corresponding to a second DQ identifier for the second DQ line when the one second DQ signal representing the one second data bit has the second value, wherein the first DQ identifier has a different value from the second DQ identifier; and programming the one first memory cell and the one second memory cell respectively based on the set first page buffer and the set second page buffer.

4. The method of claim 3, wherein the first page buffer is connected to a first bit line connected to the one first memory cell and the second page buffer is connected to a second bit line connected to the one second memory cell.

5. The method of claim 1,
wherein the first program state and the second program state have non-overlapping threshold voltage distributions, and
wherein the first program state associated with the plurality of first memory cells and the second program state associated with the plurality of second memory cells both represent the same data state for both the plurality of first memory cells and the plurality of second memory cells.

6. The method of claim 1, wherein the programming includes:
setting a first page buffer corresponding to one first memory cell to a first value and a value corresponding to a first program manner when one first DQ signal representing one first data bit has a first value and setting the first page buffer to a second value and the value corresponding to the first program manner when one the first DQ signal representing the one first data bit has a second value;

setting a second page buffer corresponding to one second memory cell to the first value and a value corresponding to a second program manner when one second DQ signal representing one second data bit has the first value and setting the second page buffer to the second value and the value corresponding to the second program manner when the one second DQ signal representing the one second data bit has the second value; and programming the one first memory cell and the one second memory cell respectively based on the set first page buffer and the set second page buffer.

7. The method of claim 6, wherein the second program manner indicates a program manner of storing "n" bits ("n" is a natural number) per cell, and the first program manner indicates a program manner of storing "m" bits ("m" is a natural number greater than "n") per cell.

8. The method of claim 7, wherein the first page buffer includes at least (n+1) data latches, and the second page buffer includes at least (m+1) data latches.

9. The method of claim 1, wherein one first DQ signal and one second DQ signal are received at the same time along with a rising or falling edge of a data strobe signal from the external device.

10. The method of claim 1, wherein an error margin of the plurality of programmed second memory cells is greater than an error margin of the plurality of programmed first memory cells.

11. A nonvolatile memory device comprising:
a first memory cell connected to a first word line and a first bit line;
a second memory cell connected to the first word line and a second bit line;
an input/output circuit configured to output a first data bit, corresponding to a first DQ signal received on a first DQ line from an external device, through a first data line and to output a second data bit, corresponding to a first DQ signal received on a second DQ line from the external device, through a second data line;
a first page buffer connected to the first bit line and the first data line, and configured to store a first latch value, based on the first data bit received through the first data line and a first DQ line code for the first DQ line; and
a second page buffer connected to the second bit line and the second data line, and configured to store a second latch value, based on the second data bit received through the second data line and a second DQ line code for the second DQ line.

12. The nonvolatile memory device of claim 11, wherein the first page buffer includes a plurality of first data latches configured to store the first latch value, and
wherein the second page buffer includes a plurality of second data latches configured to store the second latch value.

13. The nonvolatile memory device of claim 11, further comprising:
an address decoder configured to control the first word line based on an address received from the external device; and
a control logic circuit configured to control the address decoder, the input/output circuit, and the first and second page buffers such that the first and second memory cells are programmed based on the first and second latch values.

14. The nonvolatile memory device of claim 13, wherein the first memory cell programmed based on the first latch value has any one of an erase state and a first program state,
wherein the second memory cell programmed based on the second latch value has any one of the erase state and a second program state,
wherein a lower limit value of the second program state for a second group of memory cells associated with the second DQ line code is higher than a lower limit value of the first program state for a first group of memory cells associated with the first DQ line code, and
wherein the first program state for the first memory cell and the second program state for the second memory cell both represent the same data state for both memory cells.

15. The nonvolatile memory device of claim 14, wherein the first latch value corresponds to the erase state when the first data bit is a first value,
wherein the first latch value corresponds to the first DQ line code when the first data bit is a second value,
wherein the second latch value corresponds to the erase state when the second data bit is the first value, and
wherein the second latch value corresponds to the second DQ line code when the second data bit is the second value.

16. The nonvolatile memory device of claim 14, wherein the first program state of the first memory cell is verified based on a first verification voltage, and the second program state of the second memory cell is verified based on a second verification voltage higher than the first verification voltage.

17. The nonvolatile memory device of claim 14, wherein each of the first memory cell programmed based on the first latch value and the second memory cell programmed based on the second latch value is read by a first read voltage.

18. The method of claim 14, wherein an error margin of the second group of memory cells is greater than an error margin of the first group of memory cells.

19. An operation method of a nonvolatile memory device, the method comprising:
  receiving a first DQ signal representing first data from an external device through a first DQ line and receiving a second DQ signal representing second data from the external device through a second DQ line; and
  programming a plurality of first memory cells corresponding to the first DQ line respectively based on the first data and programming a plurality of second memory cells corresponding to the second DQ line respectively based on the second data,
  wherein an error margin of the plurality of programmed second memory cells is greater than an error margin of the plurality of programmed first memory cells, and
  wherein the plurality of first memory cells and the plurality of second memory cells are connected to the same word line.

20. The method of claim 19, wherein the first data stored in the plurality of first memory cells and the second data stored in the plurality of second memory cells are read by applying the same read voltage to the word line.

* * * * *